United States Patent
Schmidt et al.

(10) Patent No.: US 10,355,705 B2
(45) Date of Patent: Jul. 16, 2019

(54) SIGNAL PROCESSING SYSTEMS AND SIGNAL PROCESSING METHODS

(71) Applicants: FRAUNHOFER-GESELLSCHAFT ZUR FÖRDERUNG DER ANGEWANDTEN FORSCHUNG E.V., München (DE); TECHNISCHE UNIVERSITÄT BERLIN, Berlin (DE)

(72) Inventors: Christian Schmidt, Berlin (DE); Christoph Kottke, Berlin (DE); Volker Jungnickel, Berlin (DE); Jonas Hilt, Berlin (DE)

(73) Assignees: FRAUNHOFER-GESELLSCHAFT ZUR FÖRDERUNG DER ANGEWANDTEN FORSCHUNG E.V., München (DE); TECHNISCHE UNIVERSITÄT BERLIN, Berlin (DE)

( * ) Notice: Subject to any disclaimer, the term of this patent is extended or adjusted under 35 U.S.C. 154(b) by 8 days.

(21) Appl. No.: 15/568,481

(22) PCT Filed: Nov. 18, 2015

(86) PCT No.: PCT/EP2015/077000
§ 371 (c)(1),
(2) Date: Oct. 22, 2017

(87) PCT Pub. No.: WO2017/084705
PCT Pub. Date: May 26, 2017

(65) Prior Publication Data
US 2018/0159548 A1    Jun. 7, 2018

(51) Int. Cl.
G06G 7/26 (2006.01)
H03M 1/10 (2006.01)
(Continued)

(52) U.S. Cl.
CPC ............ *H03M 1/1009* (2013.01); *G06G 7/26* (2013.01); *H03M 1/1038* (2013.01);
(Continued)

(58) Field of Classification Search
CPC .. H03M 1/1009; H03M 1/1038; H03M 1/662; H04B 7/0837; H04B 7/0413;
(Continued)

(56) References Cited

U.S. PATENT DOCUMENTS 4,835,791 A    5/1989    Daoud
7,142,615 B2    11/2006    Hongo et al.
(Continued)

FOREIGN PATENT DOCUMENTS

JP    2003-092518 A    3/2003
JP    2008-535357 A    8/2008
(Continued)

OTHER PUBLICATIONS

Martin, "Complex Signal Processing is Not Complex", IEEE Transactions on Circuits and Systems I: Regular Papers, vol. 51, Issue 9, Sep. 2004, pp. 1823-1836.
(Continued)

*Primary Examiner* — Mohammad S Anwar
(74) *Attorney, Agent, or Firm* — Maschoff Brennan

(57) ABSTRACT

It is provided a signal processing system, comprising at least a first, a second and a third digital-to-analog converter (DAC); a processing unit configured for splitting a sampled signal into a first and a second signal corresponding to different frequency portions of the sampled signal, transmitting the first signal to the first DAC, splitting the second signal into a first and a second subsignal and transmitting the first subsignal to the second DAC and the second subsignal to the third DAC, the first subsignal corresponding to the real part of the second signal and the second subsignal
(Continued)

corresponding to the imaginary part of the second signal; an IQ mixer configured for mixing an analog output signal of the second DAC and an analog output signal of the third DAC and a combiner for combining an analog output signal of the first DAC and an output signal of the IQ mixer.

20 Claims, 17 Drawing Sheets

(51) Int. Cl.
　　　 $H03M\ 1/66$ 　　　(2006.01)
　　　 $H04B\ 7/08$ 　　　(2006.01)
　　　 $H04J\ 1/12$ 　　　(2006.01)
　　　 $H04L\ 25/02$ 　　　(2006.01)
　　　 $H04L\ 27/20$ 　　　(2006.01)
　　　 $H04B\ 7/0413$ 　　　(2017.01)

(52) U.S. Cl.
　　　CPC .......... $H03M\ 1/662$ (2013.01); $H04B\ 7/0413$ (2013.01); $H04B\ 7/0837$ (2013.01); $H04J\ 1/12$ (2013.01); $H04L\ 25/0204$ (2013.01); $H04L\ 27/2096$ (2013.01)

(58) Field of Classification Search
　　　CPC ... H04L 25/0204; H04L 27/2096; G06G 7/26; H04J 1/01
　　　See application file for complete search history.

(56) References Cited

U.S. PATENT DOCUMENTS

| | | |
|---|---|---|
| 7,535,394 B2 | 5/2009 | Pupalaikis |
| 2002/0001340 A1* | 1/2002 | Shenoi .................... H04L 5/023 375/211 |
| 2006/0019712 A1* | 1/2006 | Choi ...................... H04B 17/21 455/562.1 |
| 2007/0092018 A1 | 4/2007 | Fonseka et al. |
| 2008/0291974 A1 | 11/2008 | Collados et al. |
| 2009/0052556 A1 | 2/2009 | Fernandez |
| 2009/0232191 A1* | 9/2009 | Gupta ................. H04L 27/2096 375/216 |
| 2010/0008406 A1* | 1/2010 | Sawai ............... H04L 25/03006 375/219 |
| 2010/0176976 A1* | 7/2010 | Breems ................. H03M 3/386 341/120 |
| 2011/0140942 A1 | 6/2011 | Pagnanelli |
| 2012/0219085 A1* | 8/2012 | Long ........................ H04L 25/14 375/295 |
| 2014/0169793 A1 | 6/2014 | Harley et al. |

FOREIGN PATENT DOCUMENTS

| | | |
|---|---|---|
| JP | 2012-175268 A | 9/2012 |
| JP | 2013-515394 A | 5/2013 |

OTHER PUBLICATIONS

JP Office Action dated Jan. 15, 2019 as received in Application No. 2017-564842.

* cited by examiner

FIG 19
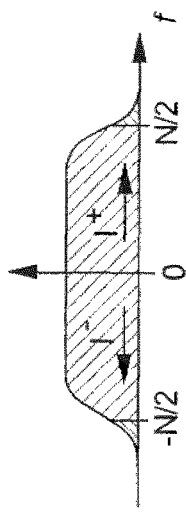
a)
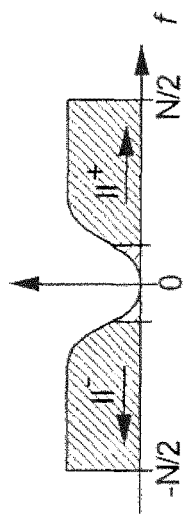
b)
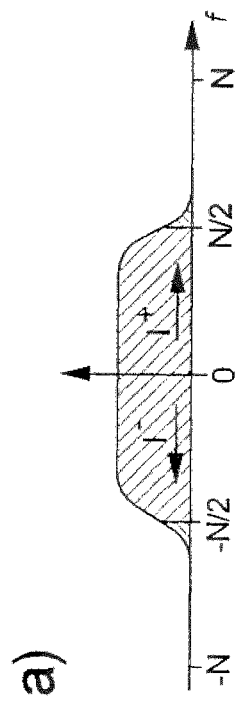
c)
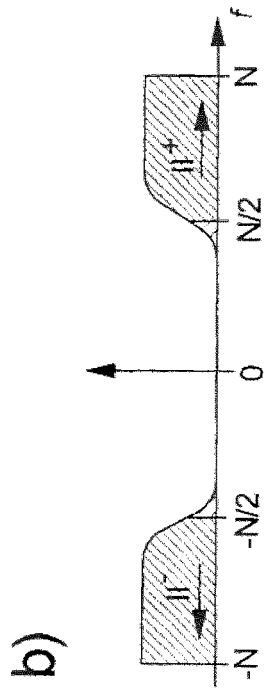
d)

SIGNAL PROCESSING SYSTEMS AND SIGNAL PROCESSING METHODS

CROSS-REFERENCE TO A RELATED APPLICATION

This application is a National Phase patent application of International Patent Application Number PCT/EP2015/077000, filed on Nov. 18, 2015.

BACKGROUND

The invention relates to signal processing systems and to a signal processing method.

The increasing need for high data rates raises the requirements on high-speed communication systems. For today's communication systems flexible transmitters based on digital-to-analog converters (DACs) are desirable. They are able to vary the modulated bandwidth and the modulation format of the transmitted signal. The performance of these devices is determined by their bandwidth and their sample rate.

However, analog components of a DAC impose limitations on the total bandwidth achievable by such a device such that systems using multiple parallelized (interleaved) DACs have been developed. Interleaving the DAC output signals may be carried out in the time or in the frequency regime. For example, U.S. Pat. No. 7,535,394 describes a hardware setup for frequency interleaving. However, the quality of the output signal of the system may be restricted due to system impairments.

SUMMARY

The objective of the invention is to improve the quality, the sample rate and/or the bandwidth of the output signal of a system consisting of multiple DACs.

According to the invention, a signal processing system is provided, whereby the system comprises
  at least a first, a second and a third digital-to-analog converter (DAC);
  a processing unit configured for splitting a sampled signal into a first and a second signal corresponding to different frequency portions of the sampled signal, transmitting the first signal to the first DAC, splitting the second signal into a first and a second subsignal and transmitting the first sub signal to the second DAC and the second sub signal to the third DAC, the first sub signal corresponding to the real part of the second signal and the second sub signal corresponding to the imaginary part of the second signal;
  an IQ mixer configured for mixing an analog output signal of the second DAC and an analog output signal of the third DAC;
  a combiner for combining an analog output signal of the first DAC and an output signal of the IQ mixer.

The IQ mixer permits to use three DACs for generating the desired output spectrum, which might have a three times larger analog bandwidth compared to a single DAC. This increase in bandwidth might be achieved without introducing significant computational overhead. The first DAC handles a first spectral portion of the sampled signal, while the IQ mixer and thus the second and the third DAC handle a second and a third spectral portion of the sampled signal.

Due to the IQ mixer the spectrum of the second signal does not need to have conjugate symmetry properties (corresponding to a real valued time domain signal). Thus, the spectrum can be defined for positive as well as for negative frequencies, wherein the resulting time domain signal may be complex valued.

The processing unit may be configured for carrying out the splitting of the sampled signal into the first and the second signal in the frequency domain. In particular, the first spectral portion of the sampled signal corresponds to a real valued signal (the first signal) which is fed directly to the first DAC. The second spectral portion may not show conjugate symmetry such that the corresponding time domain signal is complex. For example, after using a Fourier transform (e.g. an IFFT) on the second signal for generating a time domain signal, this time domain signal is separated into the real and the imaginary part (the first and the second subsignal), which are supplied to the second and third DAC, respectively. Accordingly, the processing unit might be configured for carrying out the splitting of the sampled signal into the first and the second signal in the time domain and/or may be configured for carrying out a Fourier transform of the second signal for generating the first and the second subsignal.

Splitting of the non-conjugate-symmetrical second signal spectrum for generating the first and the second subsignal supplied to the second and the third DAC can be performed in the spectral domain instead of the time domain as well. Accordingly, the processing unit may be configured for carrying out the splitting of the sampled signal into the first and the second signal in the frequency domain, wherein the processing unit may also be configured for carrying out a Fourier transform of the second signal for generating the first and the second subsignal. For example, the individual signals for inphase (the first subsignal supplied to the second DAC) and quadrature (the second sub signal supplied to the third DAC) can be obtained each by an IFFT of the corresponding spectral components directly. This variant may require the exploitation of general symmetry properties of the Fourier transformation for odd and even functions and spectra, respectively.

It is further noted that, of course, more than three DACs and/or a plurality of IQ mixers could be used. Moreover, the DACs do not have to be standard single DACs. For example, the first, second and/or third DAC may be realized by a plurality of sub-DACs. For example, at least one of the DACs is implemented by a TIDAC arrangement using time interleaving, e.g. digital time interleaving in combination with an analog summation point or a MUXDAC arrangement comprising an analog multiplexer (see detailed explanation below).

The frequency portion of the sampled signal that corresponds to the first signal may comprise lower frequencies than the frequency portion of the sampled signal that corresponds to the second signal.

According to another embodiment of the invention, the system may further comprise a low pass filter for filtering the outputs of the DACs and/or a band pass filter for filtering the output of the IQ mixer. These filters, however, are only optional. It is also possible that no analog filters are used or that at least the low pass filter or the band pass filter is omitted.

Further, the processing unit may be realized by a digital signal processor (e.g. in the form of a programmed device, i.e. a programmable device equipped with a corresponding software).

The combiner might be a passive combiner such as e.g. a power combiner, a (e.g. frequency selective) diplexer or triplexer. Further, the combiner may be an active device (e.g. a summing or a differential amplifier).

Moreover, the IQ mixer (IQ modulator) might be configured for single sideband modulation.

For example, the IQ mixer is an electronic device. However, the IQ modulator may also be realized by an opto-electronic modulator. It is noted that the invention is of course not restricted to a system using three DACs and/or one IQ mixer. Rather, more than three DACs and more than one IQ mixer (e.g. more than one IQ modulator or combinations of modulators) could be provided. In particular, combinations of different modulators could be used, e.g. combinations of at least one IQ modulator, at least one RF modulator and/or at least a modulator for single sideband (SSB) modulation. For example, eight DACs (DAC 1-8) might be used, wherein DAC 1 processes the baseband, DAC 2 supplies the inphase component of a signal to a first IQ mixer, DAC 3 supplies the quadrature component of the signal to the first IQ mixer, DAC 4 supplies a signal to a first RF modulator, DAC 5 supplies a signal to a SSB modulator, DAC 6 supplies a signal to a second RF modulator, DAC 7 supplies the inphase component of a signal to a second IQ mixer and/or DAC 8 supplies the quadrature component of the signal to the second IQ mixer. Of course, only some of these components or additional components might be used.

The invention in a second aspect relates to a signal processing method, in particular using the system described above, the method comprising the steps of:
- providing at least a first and a second digital-to-analog converter (DAC);
- splitting a sampled signal into at least a first and a second signal corresponding to different frequency portions of the sampled signal by means of a processing unit;
- pre-equalizing the first and the second signal;
- converting the pre-equalized first signal into a first analog signal using the first DAC;
- converting the pre-equalized second signal into a second analog signal using the second DAC;
- combining the first and the second analog signal using a combiner,
- wherein the processing unit, the first DAC and the combiner define a first processing channel,
- wherein the processing unit, the second DAC and the combiner define a second processing channel, wherein the pre-equalized first signal is generated by processing the first signal in such a way that the pre-equalized first signal compensates cross talk between the first and the second processing channel, and/or the pre-equalized second signal is generated by processing the second signal in such a way that the pre-equalized second signal compensates cross talk between the first and the second processing channel.

Thus, the method according to the invention generally relates to increasing the bandwidth by splitting the sampled input signal into at least a first and a second signal, using at least two DACs for digital-to-analog conversion and recombining the analog signals ("analog bandwidth interleaving"—ABI). Meaning that, instead of using a single DAC, a plurality of DACs is used, wherein, in principle, an arbitrary number of DACs could be used. The quality of the analog output signal is improved by taking into account cross talk effects between multiple processing channels (at least 2) when generating the pre-equalized signals. The generation of the pre-equalized first and the second signal might be performed by digital signal processing (e.g. by means of the processing unit or another digital signal processor).

It is noted that the first and the second processing channel might comprise further components such as analog filters. These further components may be arranged between the processing unit and the combiner. However, it is also possible that further components (e.g. a filter) for processing the output of the combiner (i.e. components arranged behind the combiner) form part of the first and the second processing channel, respectively, and are taken into account when generating the pre-equalized signals.

According to an embodiment of the invention, generating the pre-equalized first and second signal is carried out using the results of a calibration measurement with respect to at least a (e.g. spatial, frequency and/or time portion) of the first and/or the second processing channel.

In order to compensate the analog impairments of e.g. a mixer, filters, couplers, the combiner and/or the frequency response of the DACs, information about the frequency responses of these components is needed. The calibration measurement may use a channel estimation algorithm to retrieve this information for the whole system. Further, the calibration might be carried out using an external receiver or an internal receiver (that might form a common unit with the DACs).

For example, the calibration measurement is carried out using a channel estimation scheme with respect to the first and/or the second processing channel. It is noted that specific sequences for the channel estimation are not absolutely necessary, but might improve the channel estimation quality. According to an embodiment of the invention, a first channel estimation sequence is transmitted to the first DAC (and e.g. via the first processing channel) and a second channel estimation sequence is transmitted to the second DAC (and e.g. via the second processing channel), wherein the first channel estimation sequence is distinguishable from the second channel estimation sequence. For example, orthogonal sequences might be transmitted over the first and the second processing channel for channel estimation (the sequences being e.g. orthogonal with respect to frequency, time, code and/or spatially).

It is also possible that the calibration measurement comprises an S- and/or X-parameter measurement of at least a part of the analog section of the first and/or the second processing channel. For example, using the S- and/or X-parameter measurement results information about signal impairments induced by components of the multiple DAC system can be obtained. The system can be either measured as a whole or the component's parameters are measured individually and are digitally combined afterwards, wherein the measurement results can be used for factory calibration of at least some of the components. During the operation of the DAC system, the system might need to compensate a change of parameters, e.g. temperature variations of the components etc.

Accordingly, the pre-equalized first and second signal may be generated adaptively by means of the results of re-calibration measurements carried out using a portion of an analog signal produced by the combiner. That is, pre-equalization of the first and second signal may be adapted continuously during the operation of the first and the second DAC. The re-calibration might comprise measuring distinct frequency lines or frequency ranges. Further, the re-calibration may include tracking the local oscillator of a mixer (e.g. the IQ mixer described above) of the system and the compensation of phase and/or frequency deviations.

It is further noted that, of course, the IQ mixer system described above might also use the pre-equalizing method. That is, a pre-equalized first and second signal (and thus a pre-equalized first and second subsignal) might be generated and supplied to the first, the second and the third DAC. For example, the pre-equalized signals are generated (based on the first and the second signal) in such a way that they compensate cross talk between the processing channels (formed between the processing unit, the DACs and the combiner) and/or compensate an IQ imbalance of the IQ mixer (i.e. cross talk between the I and Q path of the IQ mixer).

For example, the calibration measurement comprises at least one of the following steps:
- generating a channel estimation sequence (CE sequence);
- running the channel estimation sequence with the first DAC;
- acquiring the analog signal produced by the first DAC;
- running the channel estimation sequence with the second DAC;
- acquiring the analog signal produced by the second DAC;
- estimating a path delay between the first and the second processing channel, e.g. with cross-correlation;
- performing the channel estimation using a channel estimation scheme;
- load calibration data obtained by the channel estimation (e.g. in the form of a data sequence) into a memory for use by the processing unit;
- pre-compensating the first and the second signal (sequence) using the calibration data in the frequency domain and transforming the (two) spectra to the time domain (e.g. by means of an IFFT);
- running the pre-compensated first and second sequence with the first and the second DAC, respectively.

It is noted that the first and the second DAC may be synchronized. Moreover, it is noted that the channel estimation sequence may be supplied to the first and the second DAC simultaneously.

Further, according to another embodiment of the invention, the channel estimation scheme comprises treating the combination of the first and the second processing channel as a MIMO (multiple input multiple output) system. For example, the calibration measurement comprises determining coefficients of a frequency response matrix related to the MIMO system. If the first and the second processing channel is treated as a MIMO system, the cross coupling between the channels can be modeled as a linear system in the frequency domain. However, the description as a standard MIMO problem may fail as cross talk components may be reversed in frequency. Hence, a modified MIMO formulation might be used as will be explained by means of the following exemplary formulation.

DSP (Digital Signal Processing) Operations

The sampled input signal may be a 2N-point data sequence $d=[d(0), d(1), \ldots, d(2N-1)] \in \mathbb{R}$ has to be split in the Fourier domain in order to apply it to the two DACs.

The corresponding spectrum $D=\mathcal{F}(d)=[D^+,D^-]$ (Fourier transformation) is split into first and second spectra $D_1$ and $D_2$:

$$D=[D^+,D^-]=[D_1^+,D_2^+,D_2^-,D_1^-]$$

$$D_1=[D_1^+,D_1^-]$$

$$D_2=[D_2^+,D_2^-],$$

where the plus and minus superscript denote the positive and the negative frequency range of the spectrum, respectively. It is noted that the input signal does not have to be a time domain signal. Rather, if a frequency domain modulation format, e.g. DMT or OFDM, is utilized, the input signal is first given by its frequency domain representation and might be directly split. Thus, arbitrary signals in both time and frequency domain can be processed. The splitting operation may correspond to a brick-wall filtering of a lower sideband and both a brick-wall filtering and implicit downconversion of the upper sideband. A digital local oscillator for downmixing the higher sideband is not mandatory. Further, other splitting approaches such as raised cosine filtering are possible as well, but they may introduce overhead and thus may reduce the achievable overall bandwidth. Though, they might improve the time domain behavior, since the impulse response is limited in length.

Having obtained the two data spectra (the first and the second signal), pre-equalization is performed according to $$X_1=f_{EQ1}(D_1,D_2)$$

$$X_2=f_{EQ2}(D_1,D_2),$$

where $f_{EQi}()$, with $i\in\{1,2\}$ represents an arbitrary function performing equalization. The sequences $x_i=\mathcal{F}^{-1}\{X_i\}$ (inverse Fourier transformation) with $i\in\{1,2\}$ are supplied to the first and the second DAC, respectively.

It is noted that the following explanations regarding the definition of the processing channels provide that the pre-equalizer is inactive such that $X_1(k)=D_1(k)$ and $X_2(k)=D_2(k)$, Obtaining a Channel Model If using a pre-equalizer to remove distortions, the input spectrum can be altered in the frequency region $[0,f_s/2]$ by the first DAC and in the region $[f_s/2,f_s]$ by the second DAC due to an upconversion. Frequency components located at frequencies $f>f_s$ cannot be directly modified. However, the undesired components at $f>f_s$ can be shaped by an appropriate filter or removed by utilizing oversampling in combination with an appropriate steep roll-off filter. This opens the possibility to apply DSP to undo cross-talk effects between the first and the second processing channel.

The received signal $s(n)$ (the output analog signal) is restricted to the frequency range $[-f_s,f_s]$, corresponding to a sampling rate of $2f_s$ and a spectral representation S. The spectrum is split into a lower frequency band and an upper frequency band $$S=[S^+,S^-]=[S_I^+,S_{II}^+,S_{II}^-,S_I^-].$$

$$S_I=[S_I^+,S_I^-]$$

$$S_{II}=[S_{II}^+,S_{II}^-]$$

yielding two signal spectra that are individually modifiable by the DACs.

MIMO Problem Identification

In the following, the individual frequency components of the spectra become important. The notation focuses on these by referring to $S(k)$ instead of S, whereby k denotes the discrete frequency.

For a solution of the problem the transformation of $D_1(k)$ and $D_2(k)$ to $X_1(k)$ and $X_2(k)$ has to be calculated. The actual problem encompasses cross coupling terms which are the mirror spectra of the actual spectra, which are reversed in frequency and complex conjugated. This can be described by a shift of half of the sample points of the DFT: $X(k+N/2)=X(k-N/2)$, exploiting the repetitive nature of the discrete spectrum.

The cross-coupling problem, which arises due to the non-ideal filtering is denoted as $$S_I(k)=H_{11}(k)\cdot X_1(k)+H_{12}(k)\cdot X_2(k+N/2)$$

$$S_{II}(k)=H_{21}(k)\cdot X_1(k+N/2)+H_{22}(k)\cdot X_2(k),$$

where $X_1(k)$ and $X_2(k)$ are the spectra after the equalizer (i.e. after generating the first and the second pre-equalized signal).

The derived model is a special 2×2 MIMO model and can be rewritten as a standard 4×4 MIMO model as shown below. Other approaches as a 1×1 or a 2×1 or even a 4×1 model are possible as well.

MIMO Problem Solution

As set forth above, the 2×2 MIMO ABI model is a linear equation system given by $$S_I(k) = H_{11}(k) \cdot X_1(k) + H_{12}(k) \cdot X_2(k+N/2)$$

$$S_{II}(k) = H_{21}(k) \cdot X_1(k+N/2) + H_{22}(k) \cdot X_2(k),$$

Recovering the original spectrum requires a transformation of $D_1(k)$ and $D_2(k)$ to $X_1(k)$ and $X_2(k)$, which reverts the MIMO channel effects as explained above. Therefore, the following conditions have to be met for $S_I(k)$ and $S_{II}(k)$:

$$S_I(k) \stackrel{!}{=} D_1(k)$$

$$S_{II}(k) \stackrel{!}{=} D_2(k).$$

The above linear equation system can be solved, e.g. by solving the first equation for $X_1(k)$ in terms of $X_2(k+N/2)$ and then substituting this expression into the second equation.

In general, the MIMO system is described in the frequency domain as $$S(k) = \underline{C}(k)X(k) + V(k),$$

whereby there is an individual equation for each frequency line k. $S(k)$ is the output signal, $X(k)$ is the DAC output signal and $V(k)$ is the vector of noise samples. These are given by $$S(k) = \begin{bmatrix} S_1(k) \\ S_1(k+N/2) \\ \vdots \\ S_L(k) \\ S_L(k+N/2) \end{bmatrix}, X(k) = \begin{bmatrix} X_1(k) \\ X_1(k+N/2) \\ \vdots \\ X_M(k) \\ X_M(k+N/2) \end{bmatrix},$$

$$V(k) = \begin{bmatrix} V_1(k) \\ V_1(k+N/2) \\ \vdots \\ V_L(k) \\ V_L(k+N/2) \end{bmatrix},$$

whereby L and M denote the number of receivers (e.g. frequency bands at DAC system output) and transmitters (e.g. frequency bands after splitting), respectively. The channel matrix $C(k)$ is defined as $$\underline{C}(k) = \begin{bmatrix} C_{1,1}(k) & C_{1,2}(k) & \ldots & C_{1,2M}(k) \\ C_{2,1}(k) & C_{2,2}(k) & \ldots & C_{2,2M}(k) \\ \vdots & \vdots & \ddots & \vdots \\ C_{2L,1}(k) & C_{2L,2}(k) & \ldots & C_{2L,2M}(k) \end{bmatrix}$$

The pre-equalizer undoing the channel impairments is given by the weight-matrix $W(k)$:

$$X(k) = \underline{W}(k)D(k),$$

whereby $W(k)$ and $D(k)$ are given by $$\underline{W}(k) = \begin{bmatrix} W_{1,1}(k) & W_{1,2}(k) & \ldots & W_{1,2L}(k) \\ W_{2,1}(k) & W_{2,2}(k) & \ldots & W_{2,2L}(k) \\ \vdots & \vdots & \ddots & \vdots \\ W_{2M,1}(k) & W_{2M,2}(k) & \ldots & W_{2M,2L}(k) \end{bmatrix},$$

$$D(k) = \begin{bmatrix} D_1(k) \\ D_1(k+N/2) \\ \vdots \\ D_L(k) \\ D_L(k+N/2) \end{bmatrix}.$$

There is a plurality of suited equalizers for obtaining $X(k)$ such as zero forcing equalizers, minimum mean square error (MMSE) equalizers or adaptive equalizers. As adaptive equalizer e.g. a least mean square equalizer might be used, wherein, however, other types such as recursive least squares (RLS) equalizers are possible as well as nonlinear adaptive equalizers. Using a least mean square (LMS) equalizer for adaptive equalization, the equalizer coefficients for the LMS are updated according to $$\underline{W}_{i+}(k) = \underline{W}_i(k) + \mu(D_i(k) - S_i(k))X_i^*(k)$$

with $\mu$ being the update coefficient of the LMS algorithm. By using this equalizer only the frequency components in the spectral range $[0, f_s]$ can be altered. Frequency components $f > f_s$ are influenced indirectly by modifying the frequency components close to $f < f_s$. Oversampling (see below) can be incorporated to shift the image bands to higher frequency regions. Hence, cancellation of the images is possible by applying a small oversampling factor to the data, e.g. 10%, in combination with a good (i.e. steep roll-off) analog filter. For continuously adapting the system, the state of the system might be continuously tracked. For this, e.g. a sampling oscilloscope could be inserted in the system for permitting recalibration during system operation.

It is noted that all operations carried out in the frequency domain can be of course performed analogously in the time domain. Further, for a continuous data stream additional known techniques for frequency domain equalization, such as overlap-add or overlap-save, might be introduced. Another possibility is the realization of a time domain equalizer enabling continuous operation.

The invention also relates to a signal processing system, in particular for carrying out the method described above, the system comprising:
- a processing unit configured for splitting a sampled signal into at least a first and a second signal corresponding to different frequency portions of the sampled signal;
- a pre-equalizing unit for pre-equalizing the first and the second signal;
- at least a first digital-to-analog converter (DAC) for converting the pre-equalized first signal into a first analog signal and a second DAC for converting the pre-equalized second signal into a second analog signal;
- a combiner for combining the first and the second analog signal,
- wherein the processing unit, the first DAC and the combiner define a first processing channel,
- wherein the processing unit, the second DAC and the combiner define a second processing channel,
- wherein the pre-equalizing unit (that may be part of the processing unit) is configured for generating the pre-equalized first signal by processing the first signal in such a way that the pre-equalized first signal compensates cross talk between the first and the second processing channel, and/or for generating the pre-equalized second signal by processing the second signal in such a way that the pre-equalized second signal compensates cross talk between the first and the second processing channel.

A further signal processing method comprising the steps of:
providing at least a first and a second digital-to-analog converter (DAC);
splitting a sampled signal into a first and a second signal corresponding to different frequency portions of the sampled signal using a processing unit;
creating a first analog signal based on the first signal using the first DAC;
creating a second analog signal based on the second signal using the second DAC;
combining the first and the second analog signal using a combiner, and
creating an oversampled first signal and converting the oversampled first signal by the first DAC in order to obtain the first analog signal and/or creating an oversampled second signal and converting the oversampled second signal by the second DAC in order to obtain the second analog signal.

For example, the oversampled first signal is created by oversampling the sampled signal and/or the first signal, and/or the oversampled second signal is created by oversampling the sampled signal and/or the second signal.

The oversampling in the sampled signals (the digital spectra) is used in order to move the image bands (of the analog output signal) away from the desired bands. Thus, appropriate analog filters could be used to eliminate the image bands (e.g. almost completely) and/or to avoid cross talk. However, the oversampling method might be combined with the pre-equalizing method described above, i.e. the first and the second signal are pre-equalized before being supplied to the DACs.

The oversampling might be carried out by inserting zeros in the spectrum of the sampled signal, the first signal and/or the second signal corresponding to a sinc-interpolation in the time domain. Further, the oversampling may be carried out by raised cosine filtering in the spectrum of the sampled signal, the first signal and/or the second signal. It is further noted, that other oversampling approaches are feasible as well.

The input spectrum (the sampled signal) might be divided unequally among the at least two DACs, since the signal in a first processing path (including the first DAC) undergoes filtering only once and thus does not necessarily require oversampling both at high frequencies and at low frequencies. The second signal may not be generated at base band, but at an intermediate frequency. This process is called digital upmixing or digital upconversion. Thereby, oversampling by inserting zeros might be applied. Then, the signal is upconverted with a digital local oscillator to the desired frequency. A digital image rejection filter may remove the undesired side band. Thus, spectral zeros may be generated both at high and low frequencies.

When combining the first and the second analog signal, cross talk terms distorting the signal may not be present. Only the characteristics of the analog filters and the DAC sinc-roll-off might have to be compensated.

The resulting ABI problem may be described as $S_I(k) = H_{11}(k) \cdot X_1(k)$ $S_{II}(k) = H_{22}(k) \cdot X_2(k)$ Thus, the above described MIMO processing may not be needed and the processing channels (including the first and the second DAC) might be equalized using two single input single output (SISO) filters.

Another variant of the invention uses oversampling solely either for the first DAC or for the second DAC. In the exemplary case of using oversampling for the first DAC only, the MIMO problem (see above) can be reduced to $$X_1(k) = \frac{1}{H_{11}(k)} \cdot \left( D_1(k) - \frac{H_{12}(k)}{H_{22}(k+N/2)} \cdot D_2(k+N/2) \right)$$

$$X_2(k) = \frac{1}{H_{22}(k)} \cdot D_2(k).$$

Thus, the need for equalization is reduced compared to the case without oversampling whereby being able to run at a higher overall bandwidth compared to the above described second aspect of the invention. The described oversampling method may be used with the IQ system discussed above.

The invention further is related to a signal processing system, in particular for carrying out the method described above, the system comprising:
a processing unit for splitting a sampled signal into a first and a second signal corresponding to different frequency portions of the sampled signal;
at least a first digital-to-analog converter (DAC) for creating a first analog signal based on the first signal and a second DAC for creating a second analog signal based on the second signal;
a combiner for combining the first and the second analog signal; and
an oversampling unit for creating an oversampled first signal, wherein the first DAC is configured for converting the oversampled first signal in order to obtain the first analog signal and/or for creating an oversampled second signal, wherein the second DAC is configured for converting the oversampled second signal by the second DAC in order to obtain the second analog signal.

BRIEF DESCRIPTION OF THE DRAWINGS

Embodiments of the invention are described hereinafter with reference to the drawings.

FIG. 19 shows the concept of raised cosine filtering.

DETAILED DESCRIPTION

Figure 1:
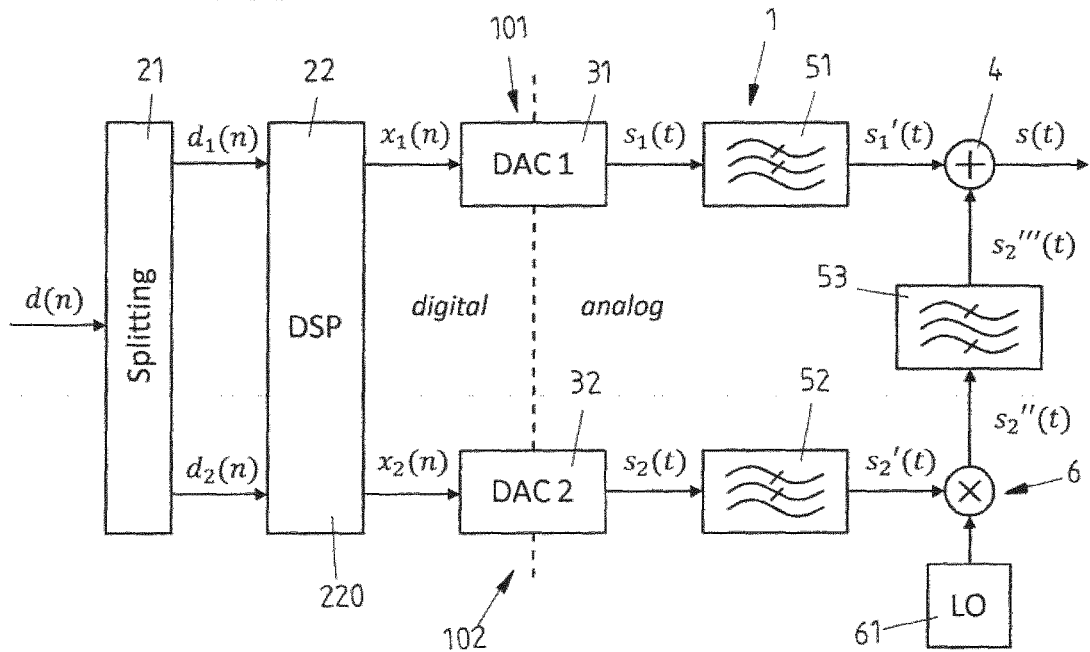
FIG. 1 shows a block diagram of a signal processing system according to an embodiment of the invention.

FIG. 1 depicts a signal processing system 1 according to an embodiment of the invention. The system 1 comprises a processing unit 21 and a digital signal processor 22. Further, the system comprises a first and a second digital-to-analog converter (DAC) 31, 32 and a combiner 4.

The processing unit 21 receives a sampled input signal d(n) and splits the sampled signal d(n) into a first and a second signal $d_1(n)$, $d_2(n)$ corresponding to different frequency portions of the sampled signal. The digital signal processor 22 realizes a pre-equalizing unit 220 generating a pre-equalized first signal $x_1(n)$ and a pre-equalized second signal $x_2(n)$ by processing the first signal $d_1(n)$ and the second signal $d_2(n)$ preferably jointly. The pre-equalized first and second signals $x_1(n)$, $x_2(n)$ are converted into a first and a second analog signal $s_1(t)$ and $s_2(t)$ by means of the first and the second DAC 31, 32, respectively. Of course, the processing unit 21 might also be realized by the digital signal processor 22.

After analog filtering (using filters 51, 52, 53) and upmixing the second analog signal $s_2(t)$ (using a mixer 6 comprising a local oscillator 61) the final analog signals $s_1'(t)$ and $s_2'''(t)$ are created. The finalized analog signals $s_1'(t)$ and $s_2'''(t)$ are combined with the combiner 4 to produce the combined output signal s(t). The operation of the processing system 1 is also illustrated in FIG. 3.

The processing unit 21, the first DAC 31 and the combiner 4 define a first processing channel 101, while the processing unit 21, the second DAC 32 and the combiner 4 define a second processing channel 102. It is noted that the filters 51, 52, 53 might be part of the processing channels 101, 102 as well. The digital signal processor 22 generates the pre-equalized first signal $x_1(n)$ in such a way that it compensates cross talk between the first and the second processing channel 101, 102, and/or generates the pre-equalized second signal $x_2(n)$ in such a way that it compensates cross talk between the first and the second processing channel 101, 102. Details of the cross talk compensation have been discussed above.

Figure 2:
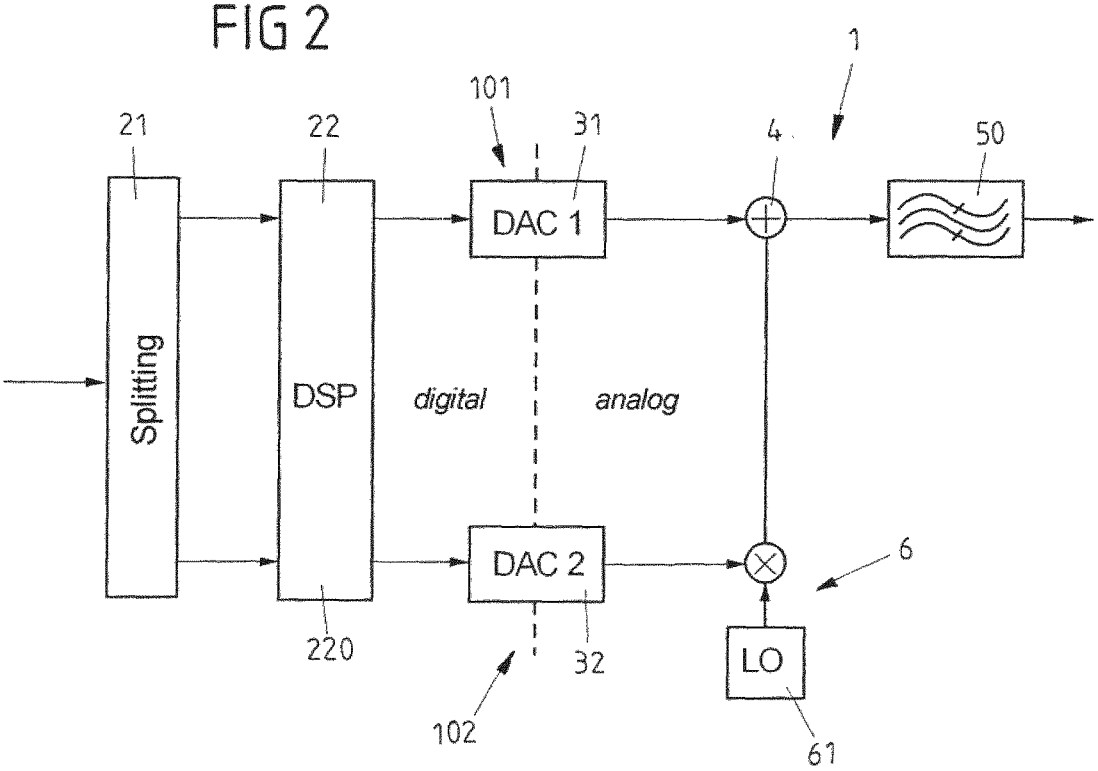
FIG. 2 shows a modification of FIG. 1.

It is noted that at least one of the analog filters 51, 52, 53 can be omitted as shown in FIG. 2. It is also possible that no analog filters are employed at all. However, a low pass filter 50 might be inserted after combining the signals (i.e. after the combiner 4) in order to suppress the upper sideband of the mixer 6. The filter 50 could be placed behind the mixer 6 as well. If the number of DACs exceeds two (and thus more than one mixer is used), the filter 50 is used for suppressing the sideband of the mixer with the highest LO frequency.

Figure 3:
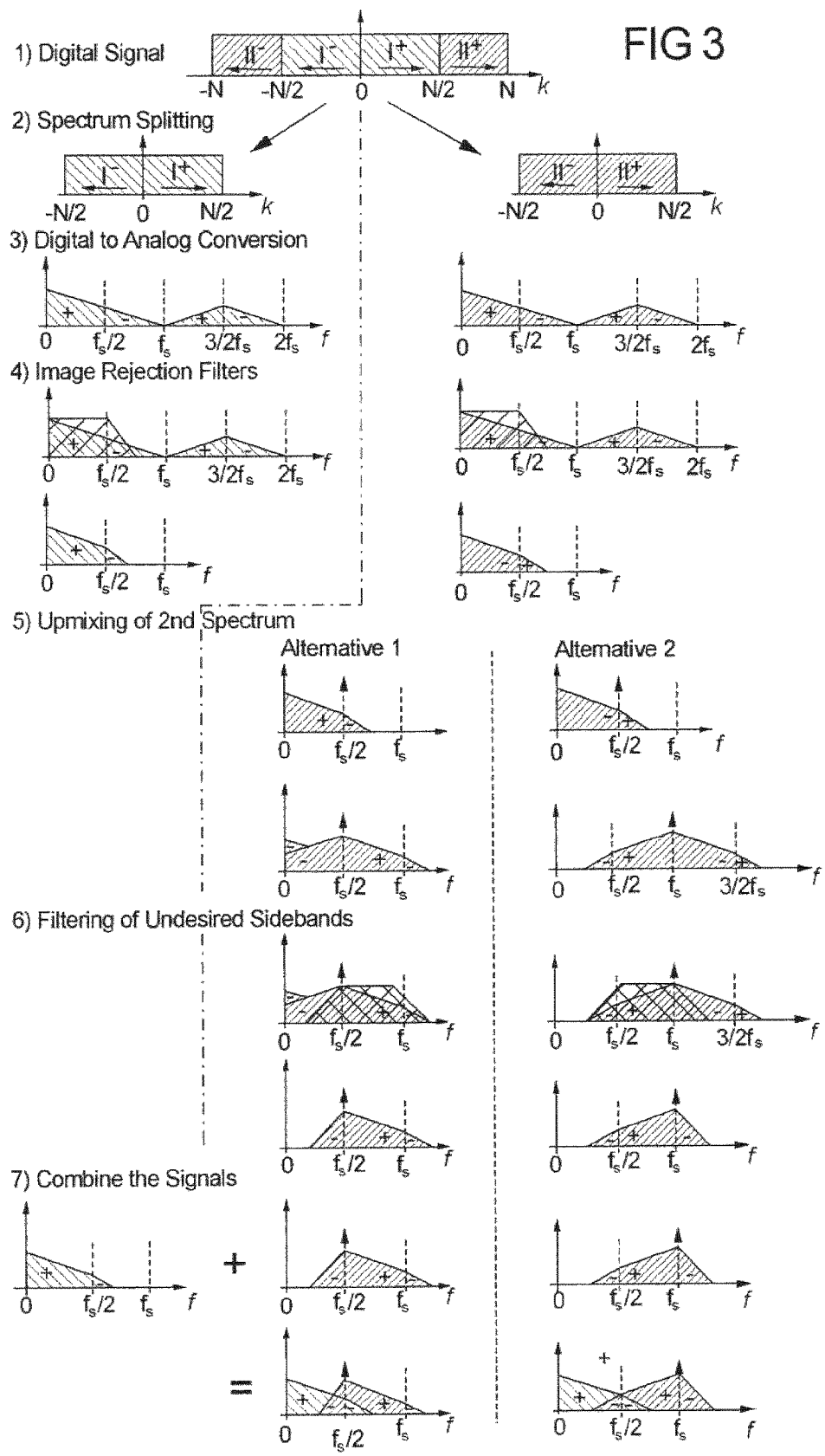
FIG. 3 shows a diagram illustrating an embodiment of a signal processing method according to the invention.

An overview of an embodiment of the method according to the invention is illustrated in FIG. 3 which might be carried out using the system shown in FIG. 1 or 2. A 2N-point digital input signal (sequence), which corresponds to the input signal d(n) in FIGS. 1 and 2, undergoes a discrete Fourier transformation (DFT) to obtain the spectral representation of the sequence (shown in step 1), wherein $I^+$, $I^-$, $II^+$ and $II^-$ describe the positive and the negative frequency bands of the signal portions I and II, respectively. The arrows denote the direction of the frequency of the bands.

As illustrated in step 2, the input signal is split into two portions of equal length N(2) in the spectral domain (e.g. using the processing unit 21 of FIG. 1 or 2). These two spectral (frequency) portions are then each transformed to the time domain by an inverse discrete Fourier transformation (IDFT). In the next step, the digital signals are fed to the DACs (e.g. DACs 31, 32 of FIG. 1 or 2), which, for example, are running at their maximum sample rate fs without any oversampling in order to generate the analog signals (step 3).

Due to the zero-order-hold (ZOH) operation of the DACs, the DAC output signals are attenuated by a sinc-function, which is indicated by triangles in step 3. The image bands are removed by appropriate low pass filters (step 4). However, the filters will not filter all image band components due to their finite roll-off characteristics. Analog processing of the first analog signal in the first processing path (see processing path 101 in FIG. 1 or FIG. 2) is finished, while the second analog signal undergoes further processing steps. For example, the second analog signal is upmixed (e.g. multiplied by a local oscillator (LO) such as the LO 61 in FIG. 1 or 2) in order to be shifted to a higher frequency region (step 5).

For example, two alternatives 1 and 2 exist for the frequency position of the LO. Either the LO is located at half of the sampling frequency fs/2 or the LO is located directly at the sampling frequency fs. For carrying out the second alternative, the corresponding spectrum has to be digitally inverted prior to the D/A conversion in order to ensure the right frequency orientation in the upper band at the end of the processing. The upconversion with a cosine carrier will generate two side bands. One of these side bands is redundant and can be removed by a band pass filter (step 6). Finally, the two individual analog signals are combined (using e.g. the combiner 4 in FIG. 1 or 2) in order to form an analog representation of the digital input waveform with a bandwidth of fs and a sampling rate of 2 fs (step 7).

In case the mixer 6 shall be omitted, Beyond-Nyquist signaling can be used: The second signal would be generated as in alternative 2 by means of digital spectrum inversion. Instead of using a low pass filter after the DAC in step 3, a band pass filter would be utilized in order to select the frequencies in the second Nyquist zone in the frequency range [fs/2, fs]. The non-linearity distortions caused by the mixer could be avoided. Furthermore, LO phase noise is circumvented. A possible disadvantage of this variant might be a higher loss in amplitude at frequencies close to fs due to the sinc roll-off. This could be avoided by using return-to-zero (RZ) instead of non-return-to-zero (NRZ) operation for the DAC.

Moreover, in alternative 1 the LO is located in-band and thus may disturb the signal (waveform). In order to reduce this interference, a (e.g. very good) notch filter could be employed to cancel the LO line. However, this might produce degradations of a time domain waveform. Though, a frequency domain waveform, e.g. OFDM, might be affected less. Furthermore, if the phase of the LO was known, a digital LO could be generated and inserted in the digital signal, which cancels the disturbing LO line in the analog signal.

Figure 4:
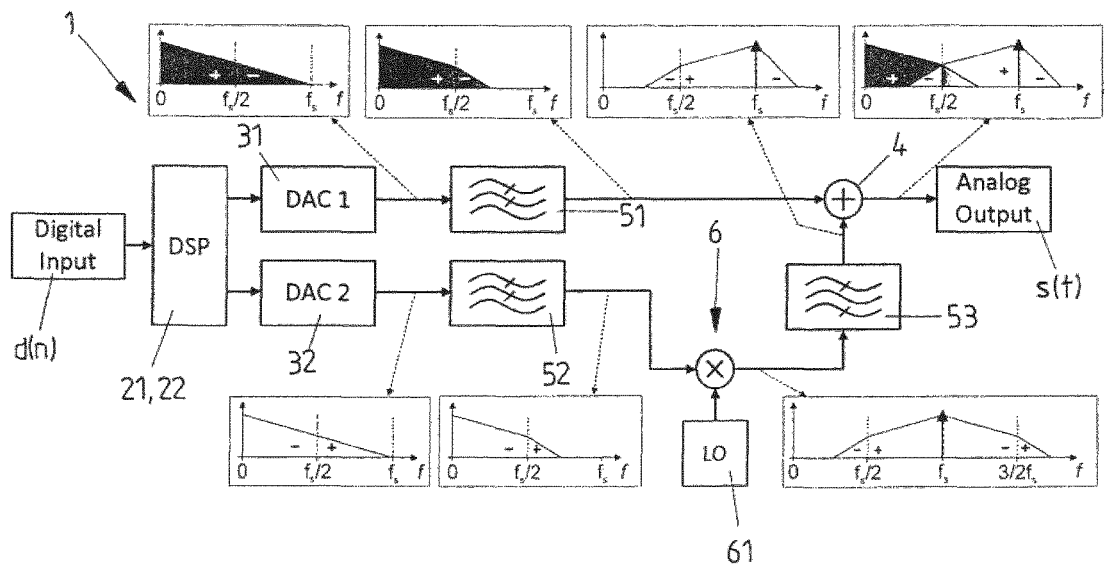
FIG. 4 shows a block diagram of the system of FIG. 1 showing spectra at specific positions of the system.

The block diagram shown in FIG. 4 relates the spectra shown in FIG. 3 to the system 1 depicted in FIG. 1. It is noted that the processing unit 21 and the digital signal processor 22 (and thus the pre-equalizing) are combined in a common unit.

Figure 5:
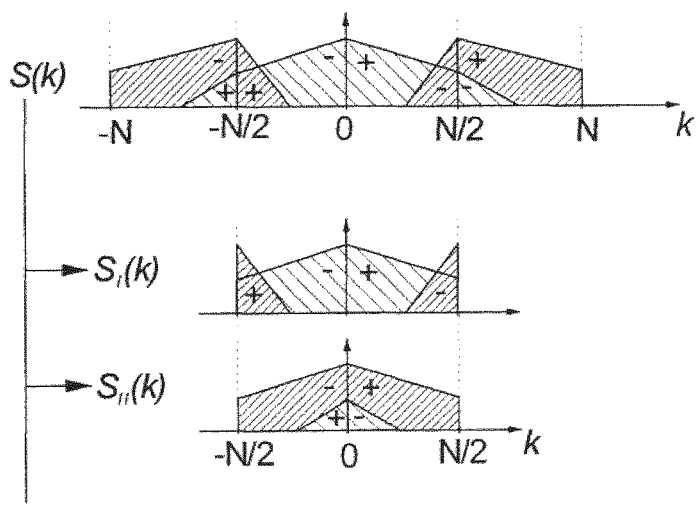
FIG. 5 shows a diagram illustrating portions of the received frequency spectra.

FIG. 5 illustrates the spectral representation S of the received signal being restricted to the frequency range [−fs, fs], corresponding to a sampling rate of 2fs. Although the received signal is a real valued signal, a two-sided spectrum is shown here instead of the single-sided spectrum, because the DFT yields a two-sided spectrum. The spectrum is split into a lower frequency band $S_I(k)$ and an upper frequency band $S_{II}(k)$, as already set forth above:

$$S=[S^+,S^-]=[S_I^+,S_{II}^+,S_{II}^-,S_I^-],$$

$$S_I=[S_I^+,S_I^-]$$

$$S_{II}=[S_{II}^+,S_{II}^-]$$

Figure 6:
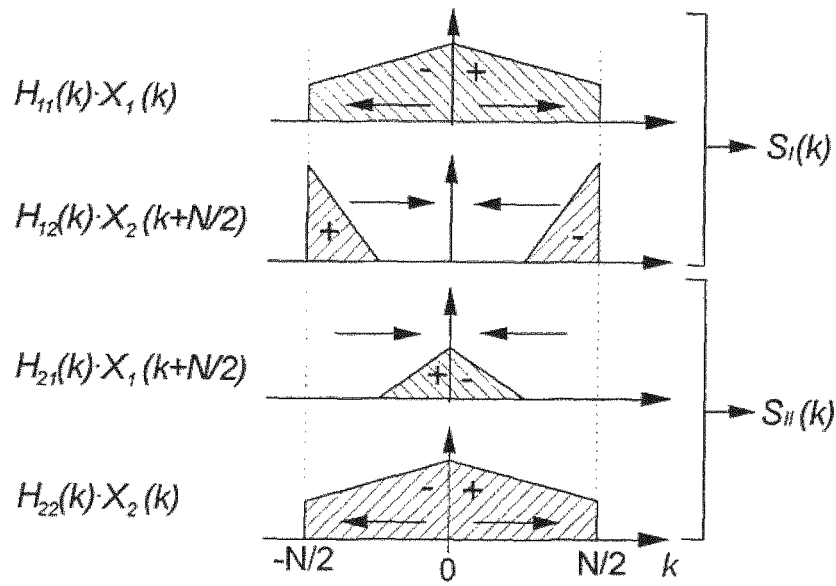
FIG. 6 shows a diagram illustrating components of the received frequency spectra.

Another representation of the spectra $S_I(k)$ and $S_{II}(k)$ is shown in FIG. 6. The spectra $S_I(k)$ and $S_{II}(k)$ are each separated into the desired main components and the undesired cross talk components. As already discussed above, the problem encompasses cross coupling terms which are the mirror spectra of the actual spectra. The arrows in FIG. 6, which denote the direction of frequency, visualize that the spectra are reversed in frequency and complex conjugated. This operation can be described by a shift of half of the sample points of the discrete Fourier transformation (DFT): $X(k+N/2)=X(k-N/2)$, thereby exploiting the repetitive nature of the discrete spectrum.

Figure 7:
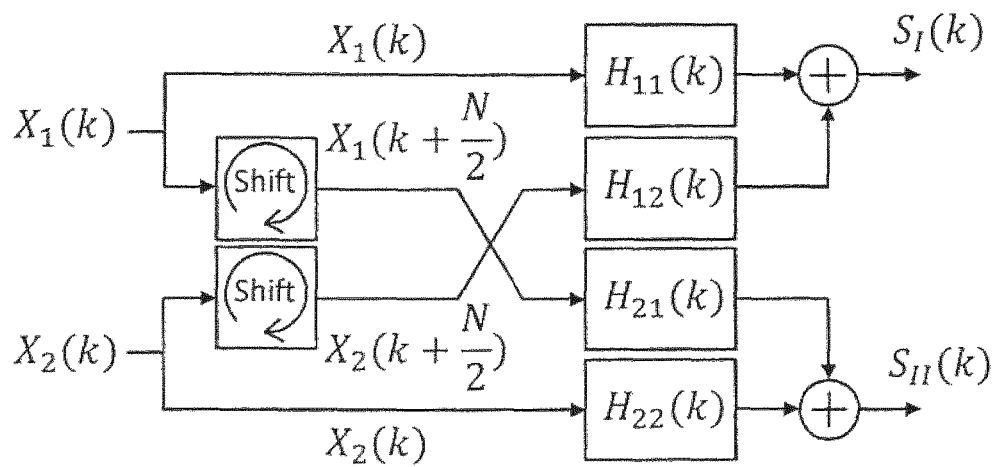
FIG. 7 shows a block diagram illustrating the MIMO model.

As already set forth above, the cross coupling problem, which arises due to the non-ideal filtering as shown in FIG. 5, is denoted as $$S_I(k)=H_{11}(k)\cdot X_1(k)+H_{12}(k)\cdot X_2(k+N/2)$$

$$S_{II}(k)=H_{21}(k)\cdot X_1(k+N/2)+H_{22}(k)\cdot X_2(k),$$

where $X_1(k)$ and $X_2(k)$ are the spectra after the equalizer (after performing the pre-equalizing of the first and the second signal). This MIMO system is visualized in FIG. 7. Straightaway, the difference to a standard MIMO problem becomes visible with two additional shift operations in the frequency domain. The derived model is a special 2×2 MIMO model and can also be rewritten as a standard 4×4 MIMO model as described above. Other approaches such as a 1×1, a 2×1 or even a 4×1 model are possible as well.

Figure 8:
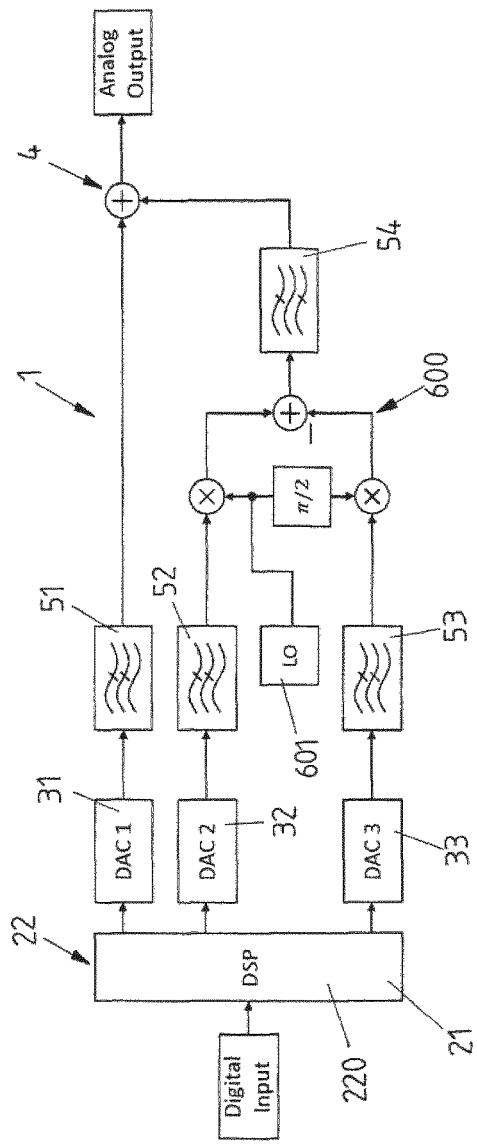
FIG. 8 shows a block diagram of a signal processing system according to another embodiment of the invention.

FIG. 8 depicts a signal processing system 1 according to another embodiment of the invention. System 1 comprises a first, a second and a third DAC 31, 32, 33 receiving a digital (sampled) input signal from a DSP unit 22. A processing unit 21 for splitting the sampled input signal into split signals corresponding to different frequency portions of the sampled signal is provided by the DSP unit 22 or might be realized by a separate unit.

The processing unit 21 splits the input signal into a first and a second signal corresponding to a first and a second frequency portion of the sampled signal, wherein the first signal is transmitted to the first DAC 31. The second signal is split into a first and a second subsignal, wherein the first subsignal is supplied to the second DAC 32, while the second subsignal is supplied to the third DAC 33. The first subsignal corresponds to the real part of the second signal and the second subsignal corresponds to the imaginary part of the second signal (see FIG. 10).

The processing system 1 further comprises an IQ mixer 600 (comprising a local oscillator 601) receiving an analog output signal of the second DAC 32 and an analog output signal of the third DAC 33. The IQ mixer 600 mixes the output signals of the DACs 32, 33 and transmits its output to a combiner 4 (via an analog filter 54). The combiner 4 thus combines the output signal of the IQ mixer 600 with the output signal of the first DAC 31. It is noted that the output signals of the DACs 31-33 are fed to the combiner 4 and the IQ mixer 600, respectively, via analog filters 51-53. However, at least some of the filters 51-54 may be omitted as indicated in FIG. 9.

Figure 10:
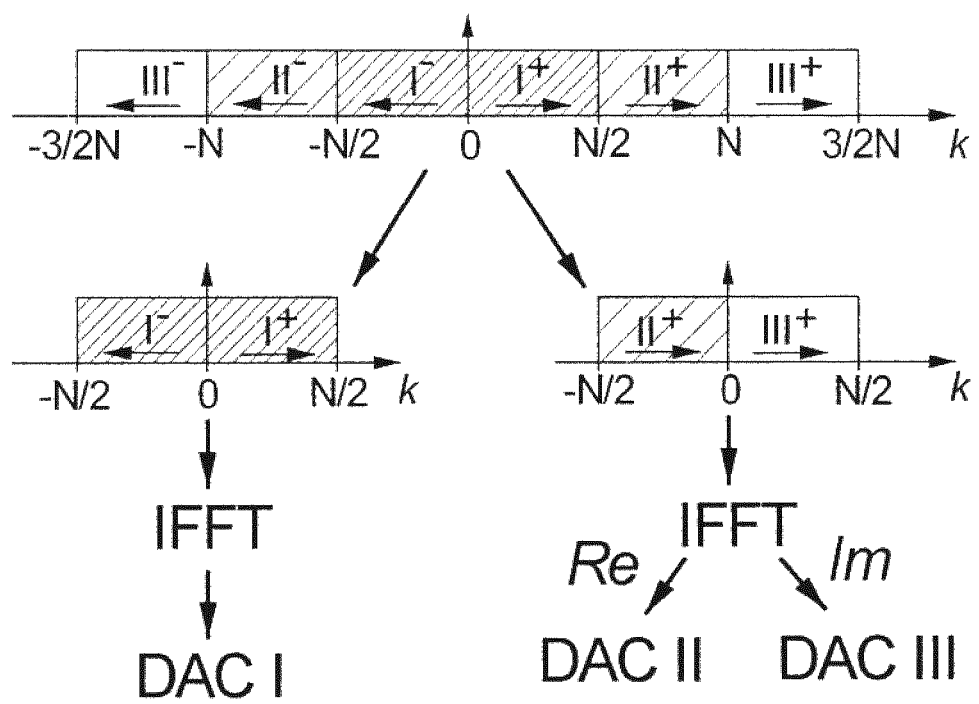
FIG. 10 shows a diagram illustrating the spectral splitting scheme using the system of FIG. 8 or 9.

Due to the IQ mixer 600, the spectrum of the second signal does not need to possess conjugate symmetry properties corresponding to a real valued time domain signal. Thus, the spectrum can be defined for the positive as well as for the negative frequencies independently and the resulting time domain signal is complex valued. FIG. 10 shows the partitioning of the input signal (data) spectrum. The spectrum is split into two parts. The first part (comprising the spectrum portion I$^-$, I$^+$ corresponds to a real valued signal which is fed directly to the first DAC 31. The second part of the spectrum (comprising the spectrum portion II$^+$, III$^+$) does not show conjugate symmetry such that the corresponding time domain signal is complex. After a Fourier transformation (e.g. an IFFT), the time domain signal is separated into the real and the imaginary part (i.e. the first and the second subsignal), which are fed to the second and the third DAC, respectively.

As mentioned above, splitting of the non-conjugate-symmetrical spectrum for the first and the second DAC can be performed in the spectral domain instead of the time domain as well. Therefore, the individual signals for the inphase component (second DAC 32) and the quadrature component (third DAC 33) can be obtained each by a Fourier transformation (e.g. an IFFT) of certain spectral components directly. This step requires the exploitation of the general symmetry properties of the Fourier transformation for odd and even functions and spectra, respectively.

Figure 9:
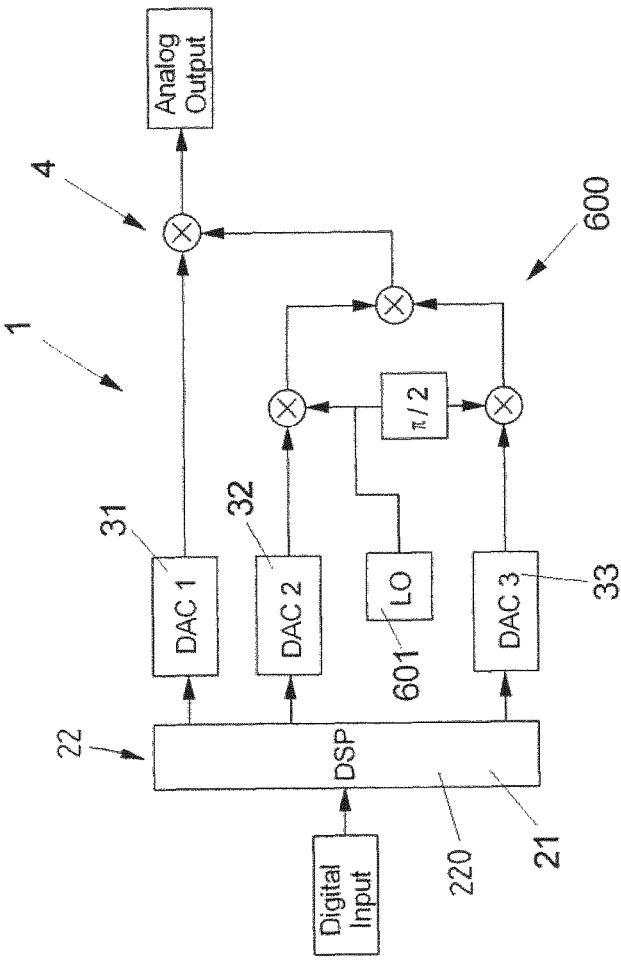
FIG. 9 shows a modification of FIG. 8.
Figure 11:
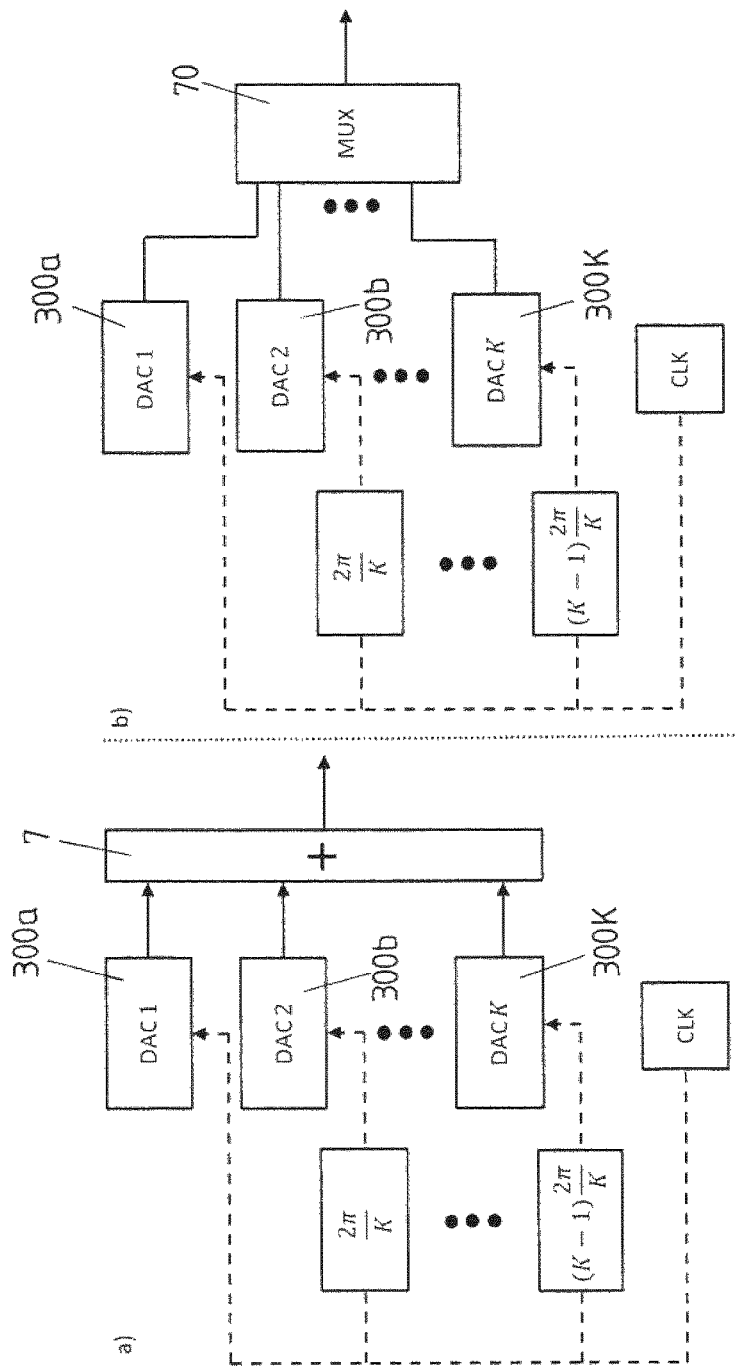
FIG. 11 shows possible implementations of the DACs.

It is further noted that more than three DACs might be used and that the DACs 31-33 of FIGS. 8 and 9 do not need to be separate standard single DACs. For example, at least some of them might be realized by a plurality of sub-DACs. For example, the sub-DACs 300a-300k can be either implemented as TIDACs using digital time interleaving in combination with an analog summation point 7 as shown in FIG. 11a). Further, they might be realized as MUXDACs with an analog multiplexer 70 (MUXDAC) as shown in FIG. 11b). The MUXDAC realization does not necessarily need to combine all outputs of the DACs 300a-300k in a single multiplexer. Rather, a multiple-stage multiplexer is possible as well, e.g. in the case of 8 DACs: 3 stages of 2:1 multiplexers (first stage: 4×2:1, second stage: 2×2:1, third stage: 1×2:1. Note, that the individual sub-DACs 300a-300k could be frequency interleaved as well, thereby creating multiple hierarchies of frequency interleaved DACs.

Further, the system 1 may also comprise a pre-equalizing unit 220 as discussed above with respect to FIGS. 1 and 2, wherein the pre-equalizing unit is configured for pre-equalizing the signals supplied to DACs 31-33.

Figure 12:
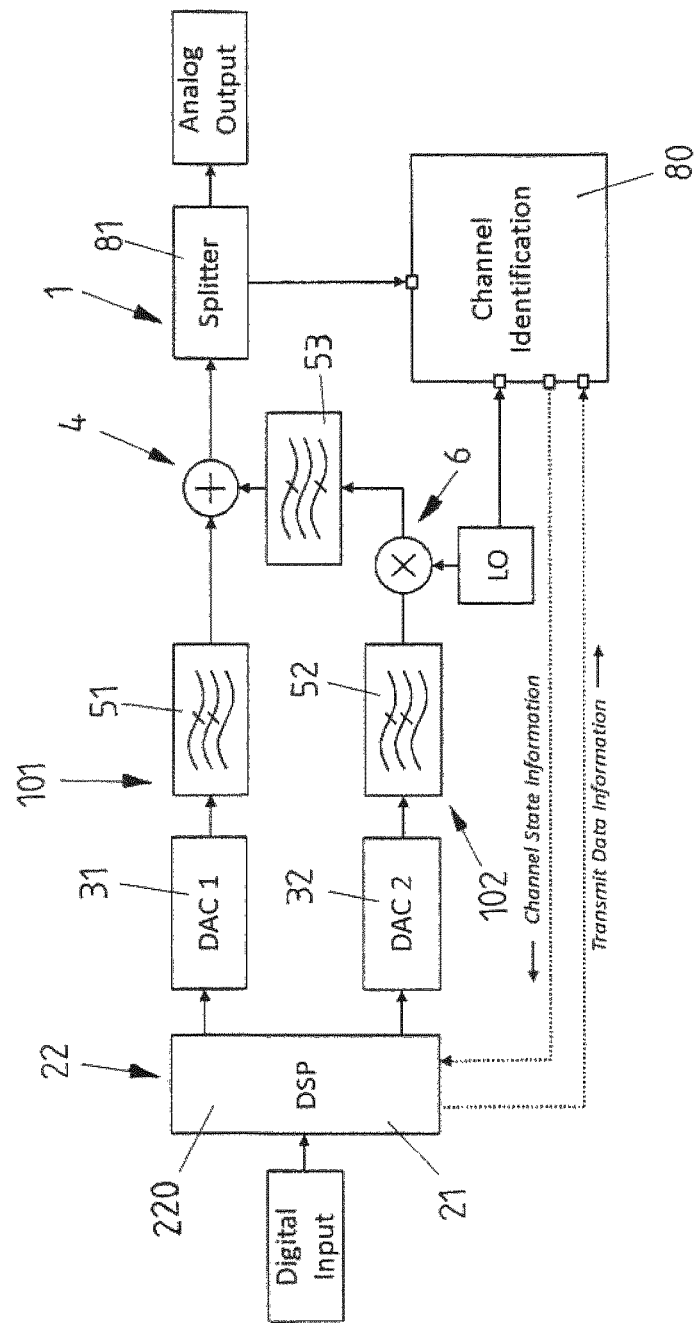
FIG. 12 shows a block diagram illustrating a calibration setup.

FIG. 12 illustrates another processing system 1 according to the invention based on the system shown in FIG. 1 and configured for carrying out a calibration procedure. In order to carry out a calibration, the system 1 comprises a channel identification unit 80 used for carrying out a channel estimation regarding the first and the second processing channel 101, 102. A splitter 81 is used for branching off a portion of the output signal of the combiner 4, the branched off portion being supplied to the channel identification unit 80. Of course, a switch could be used instead of the splitter as well.

Figure 13:
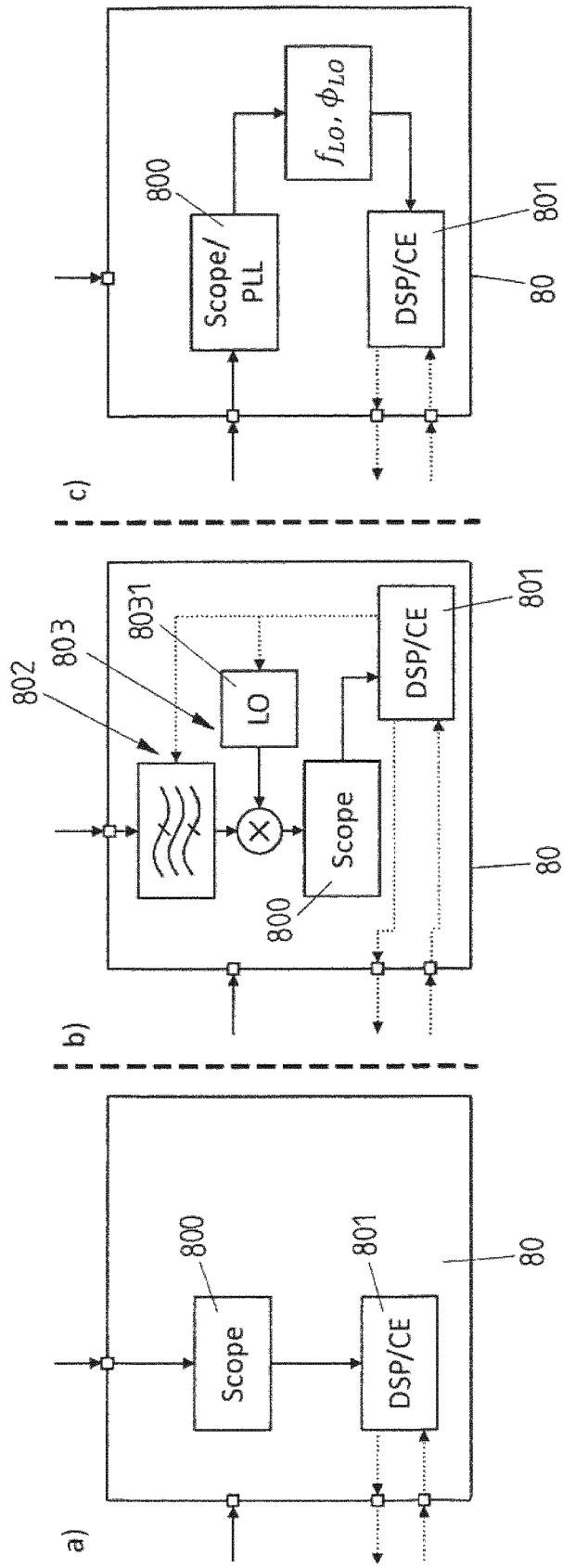
FIG. 13 shows different realizations of a channel identification system.

FIGS. 13a) to 13c) show different realizations of the channel identification unit 80. According to FIG. 13a), the full spectrum of the signal (produced by splitter 81) is acquired (using an oscilloscope 800) and processed by a DSP/CE block 801. According to FIG. 13b), fractions of the signal are obtained by filtering (using a filter 802) and down conversion (using a mixer 803), thus limiting the requirements for the bandwidth and the sample rate of oscilloscope 800. The filter and the LO 8031 of the mixer 803 might be tunable, thereby enabling the iterative identification of the full spectrum. The sequentially obtained information is recombined digitally, thus obtaining information about the full spectral width.

Further, in FIG. 13c) information about the LO's frequency $f_{LO}$ and phase $\phi_{LO}$ is acquired, only, since the LO 61, 601 is the only critical dynamical element in the system setup. It is either obtained by a notch filter in combination with a scope or by reading the information about the current frequency and phase from a PLL (using oscilloscope 800) for the stabilization of the LO. An initial channel identification might be needed for this variant.

The invention is of course not limited to the realizations shown in FIGS. 13a) to c). For example, hybrid variants as well as related variants are possible. Further, dedicated sequences for the channel estimation are not absolutely necessary, but might improve the channel estimation quality.

Further, as already set forth above, in order to compensate analog impairments of the mixer 6, the filters 51-53, the combiner 4 and/or the frequency response of DACs 31, 32, information about the impulse responses and/or frequency responses of these systems is needed. The calibration routine uses a channel estimation algorithm (see above) to retrieve this information for the whole system. However, it is possible as well to use S-parameter analyzers or X-parameter analyzers to obtain this information. The system can be either measured as a whole or the component's parameters are measured individually and are digitally combined afterwards. During operation system 1 might need to compensate for changing parameters, e.g. component's temperature variations etc. In particular, the calibration procedure is used during operation of system 1 in order to constantly adapt the system 1. Possible calibration procedure have been already explained above.

Figure 14:
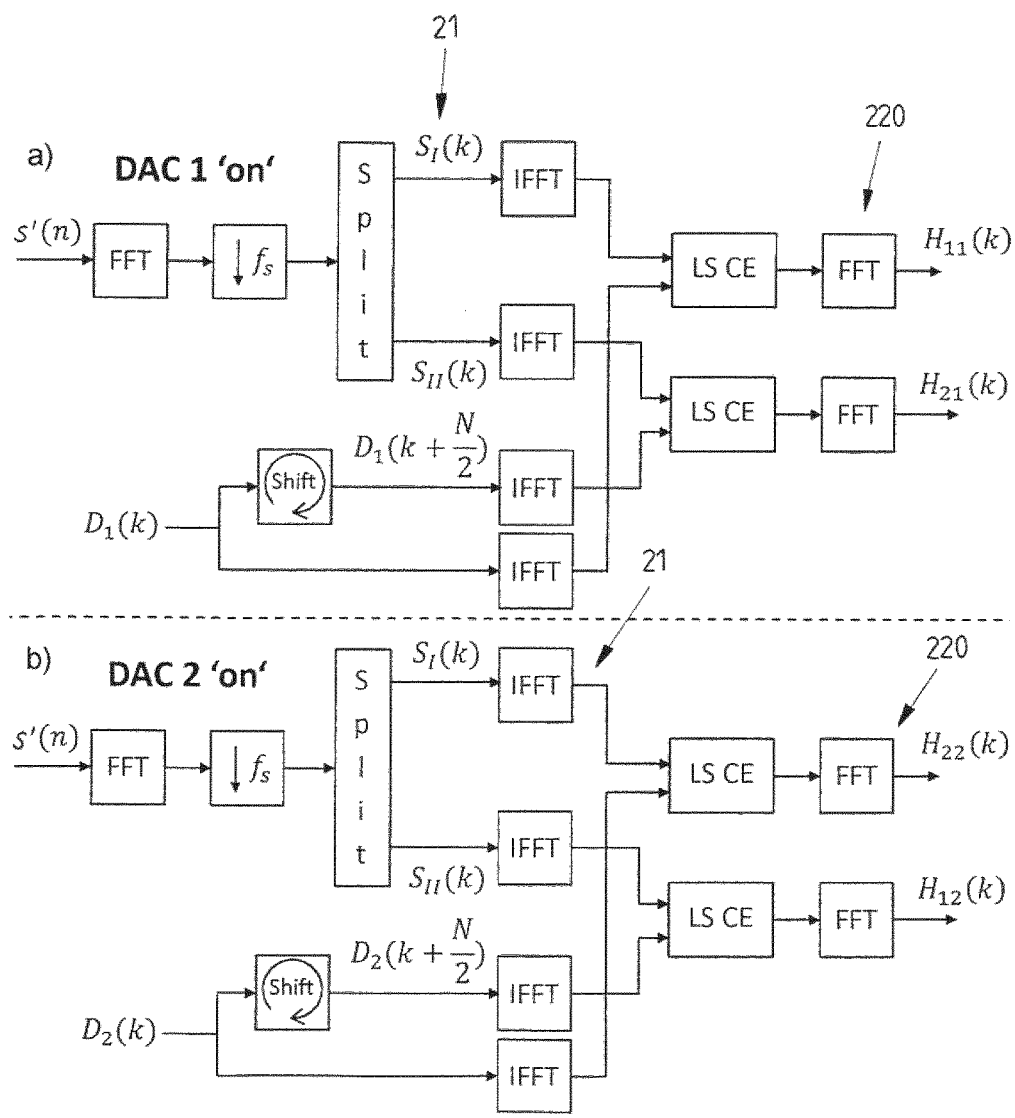
FIG. 14 shows a diagram illustrating channel estimation schemes.

For example, the calibration procedure uses channel estimation schemes illustrated in FIGS. 14a), 14b) and 16. According to FIG. 14a), only the first DAC 31 is running, wherein the signal s'(t) (from splitter 81) is acquired by the oscilloscope 800 of the channel identification unit 80. A FFT is computed (using the DSP unit 801) and the resulting signal is down-sampled in the spectral domain to $2f_s$. After splitting the spectrum into two parts, the spectra are converted into the time domain, where two individual Least-Squares (LS) CEs are performed. One of them with the sequence representing the image spectrum and the other with the sequence representing the regular spectrum. Lastly, the obtained channel impulse responses are transformed to the frequency domain yielding $H_{11}(k)$ and $H_{21}(k)$. The same procedure is used to calculate $H_{12}(k)$ and $H_{22}(k)$, but for the difference that only the second DAC 32 is running (FIG. 14b). The channel frequency responses are later interpolated to match the length of the data pattern in order to perform frequency domain equalization (FDE).

Besides, the CE can be performed with the ABI sequences (i.e. the payload sequences) as well, but the quality might be improved by using e.g. a De Bruijn Binary Sequence (DBBS) pattern of equal length. Note, that the channel estimation can be performed in the frequency domain as well.

Figure 15:
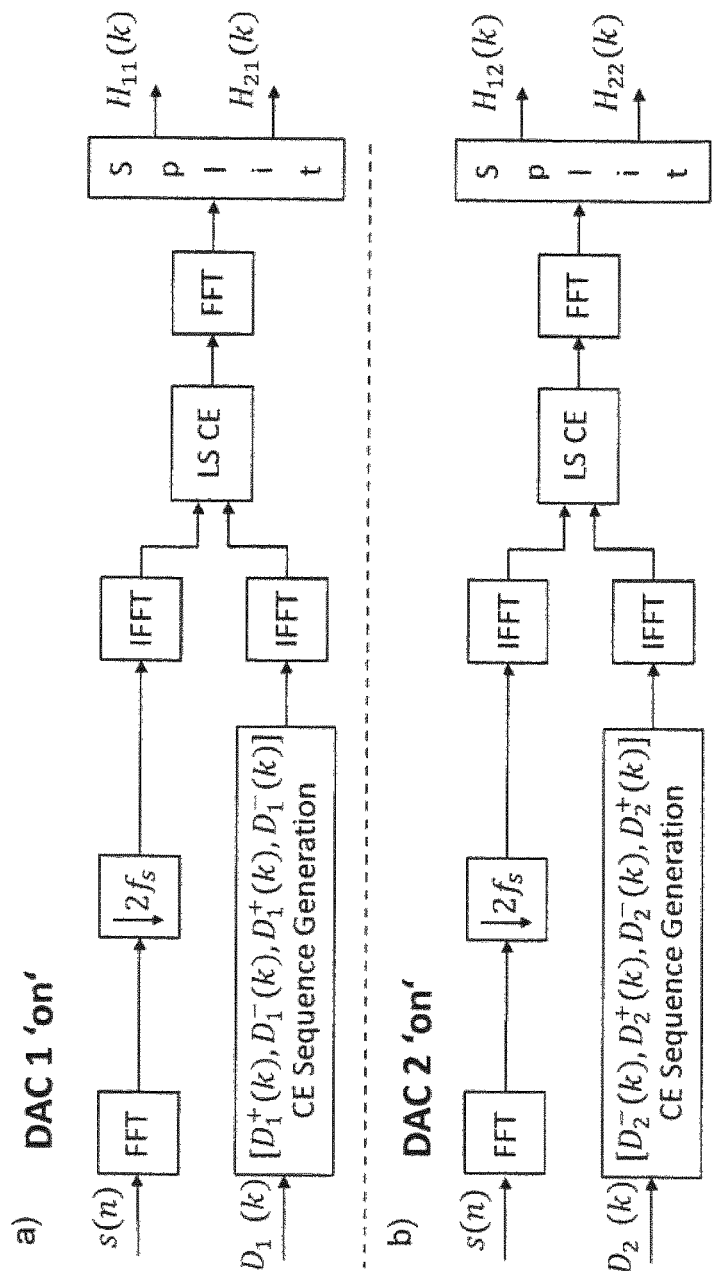
FIG. 15 shows a modification of FIG. 14.

In order to circumvent problems with the aforementioned CE scheme, another scheme is presented in FIG. 15. According this scheme, a reduced number of FFT/IFFT operations is utilized. The CE sequences of the scheme presented in the previous section could determine spectral components in the range $[0, f_s/2]$ and $[f_s/2, f_s]$. With these new sequences spectral components in the range $[0, f_s]$ can be estimated in a single step and thus a more efficient and reliable estimation may be obtained.

Figure 16:
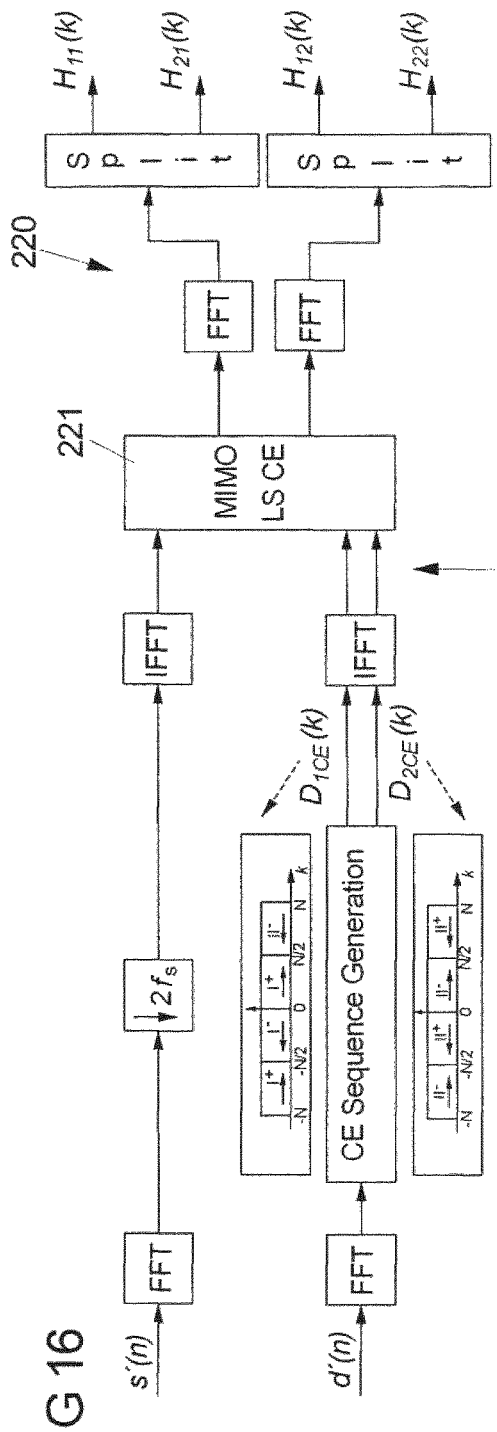
FIG. 16 shows another modification the channel estimation scheme.

Another solution (FIG. 16) uses a MIMO least squares channel estimation scheme, whereby the MIMO 2×1 channel is estimated jointly. The resulting frequency responses are split in the frequency domain in order to retrieve four channel frequency responses.

Figure 17:
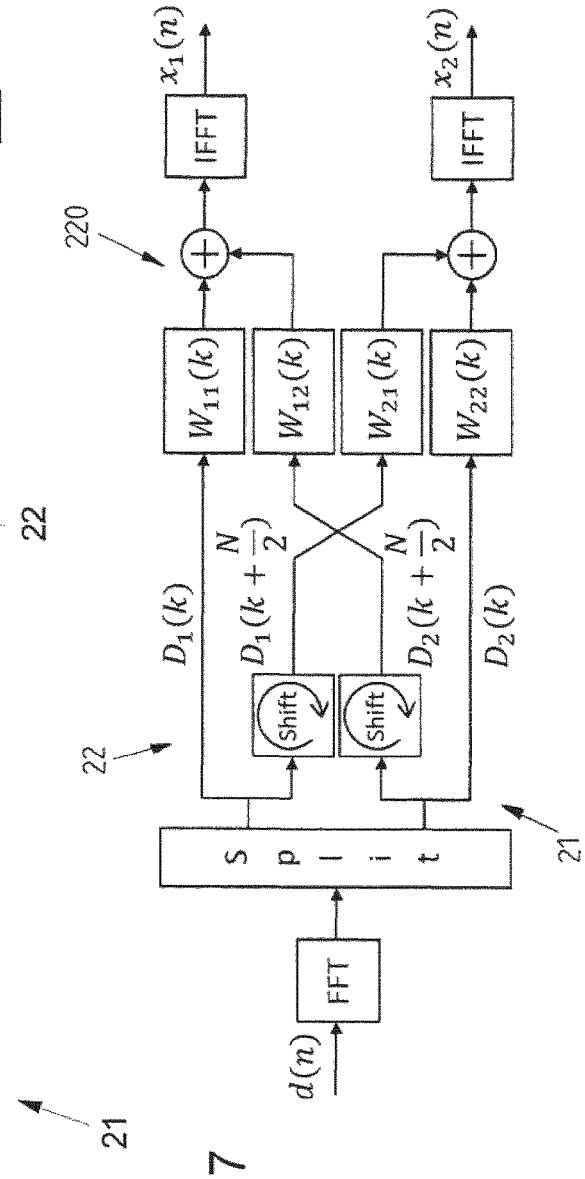
FIG. 17 shows a diagram illustrating MIMO digital signal processing.

The DSP steps for the ABI scheme using a repetitive data sequence, e.g. for an arbitrary waveform generator (AWG), are shown in FIG. 17. Using a frequency domain modulation format, e.g. OFDM or DMT, obviates the need for the first FFT Operation. The input signal (sequence) d(n) is transformed to the frequency domain using a fast Fourier transform (FFT). Then, it is split into two parts $D_1(k)$ and $D_2(k)$. Further, a shifted and a non-shifted version of both $D_1(k)$ and $D_2(k)$ are generated. The equalizers are applied (i.e. the pre-equalizing is performed) to the spectra $D_j(k)$ and $D_j(k+N/2)$ with i, j∈{1,2}. The resulting spectra are transformed to the time domain via an inverse fast Fourier transform (IFFT) operation and the resulting sequences can be fed to the DACs 31, 32. The equalizer coefficients $W_{ij}(k)$ with i, j∈{2, 2} are given by the solution for the 2×2-MIMO problem as discussed above.

Figure 18:
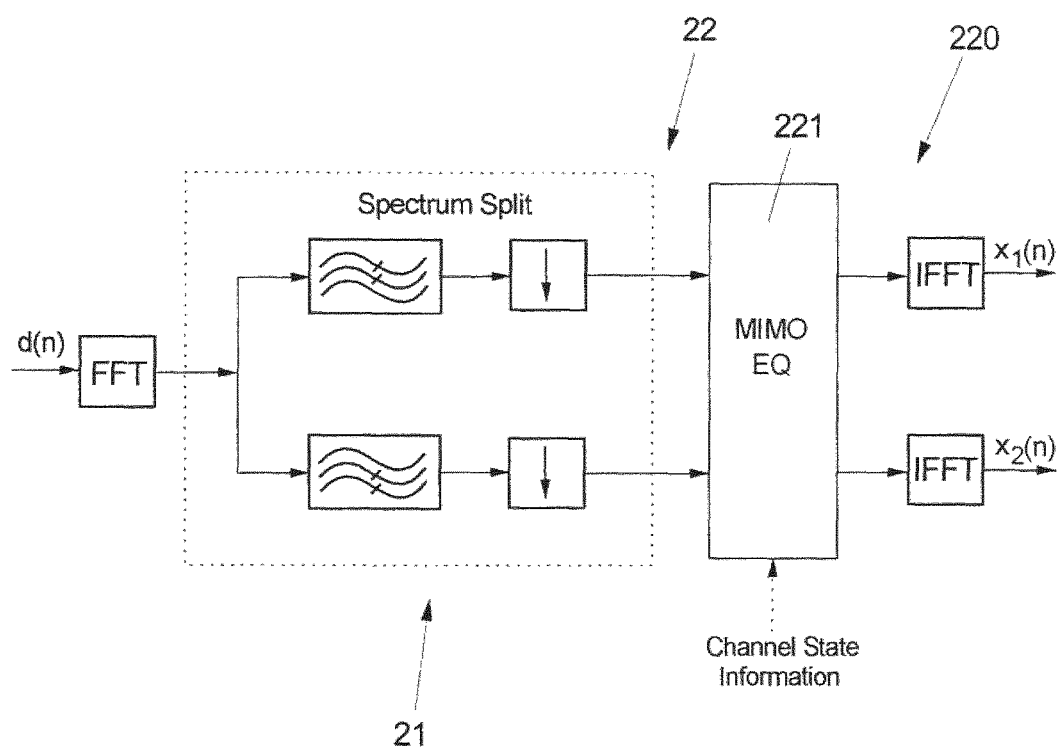
FIG. 18 shows a diagram further illustrating MIMO digital signal processing.

FIG. 18 generally illustrates an example of carrying out the splitting of the input signal and the pre-equalization (which e.g. be used with the system of FIGS. 1 and 2, but also with the IQ mixer system illustrated in FIG. 8 or 9). The input sequence d(n) is transformed into its spectral representation using an FFT. In the spectral domain the sequence is split into two parts (using the processing unit 21), i.e. the first and the second signal are generated. The first part corresponds to low frequency (LF) components and the second part to high frequency (HF) components of the input signal. The splitting can be done by partitioning the spectrum, whereby low frequency samples and high frequency samples are picked from the frequency domain representation in order to generate spectral representations of the two sequences (the first and the second signal). This operation might comprise a rate change. In FIG. 18, the rate change is denoted by the downward arrows.

Now, a MIMO equalizer 221 of the pre-equalizing unit 220 follows, which compensates (as already mentioned above) e.g.

a) magnitude and/or phase in each frequency band b) magnitude and/or phase mismatches between the frequency bands and c) cross talk between the frequency bands.

d) and might also account for non-linear distortions

There are multiple ways of achieving the spectrum split (i.e. for configuring the processing unit 21). In the following two possibilities are explained. The main condition for the splitting functions is to equal 1 over all discrete frequencies and/or to ensure that all discrete frequency components are present in one or the other frequency portion.

For example (see steps 1 and 2 of above FIG. 3), brickwall filtering might be used for the lower frequency portion of the input signal corresponding to ideal low pass filtering combined with down sampling of e.g. a factor 2 (if the input signal (spectrum) is split equally). For the higher frequency portion this operation corresponds to bandpass (highpass) filtering followed by downmixing and an additional ideal lowpass filtering action. For example, factor 2 downsampling follows (if the input signal is split equally). In the frequency domain this can be achieved by selecting the appropriate samples.

Figure 20:
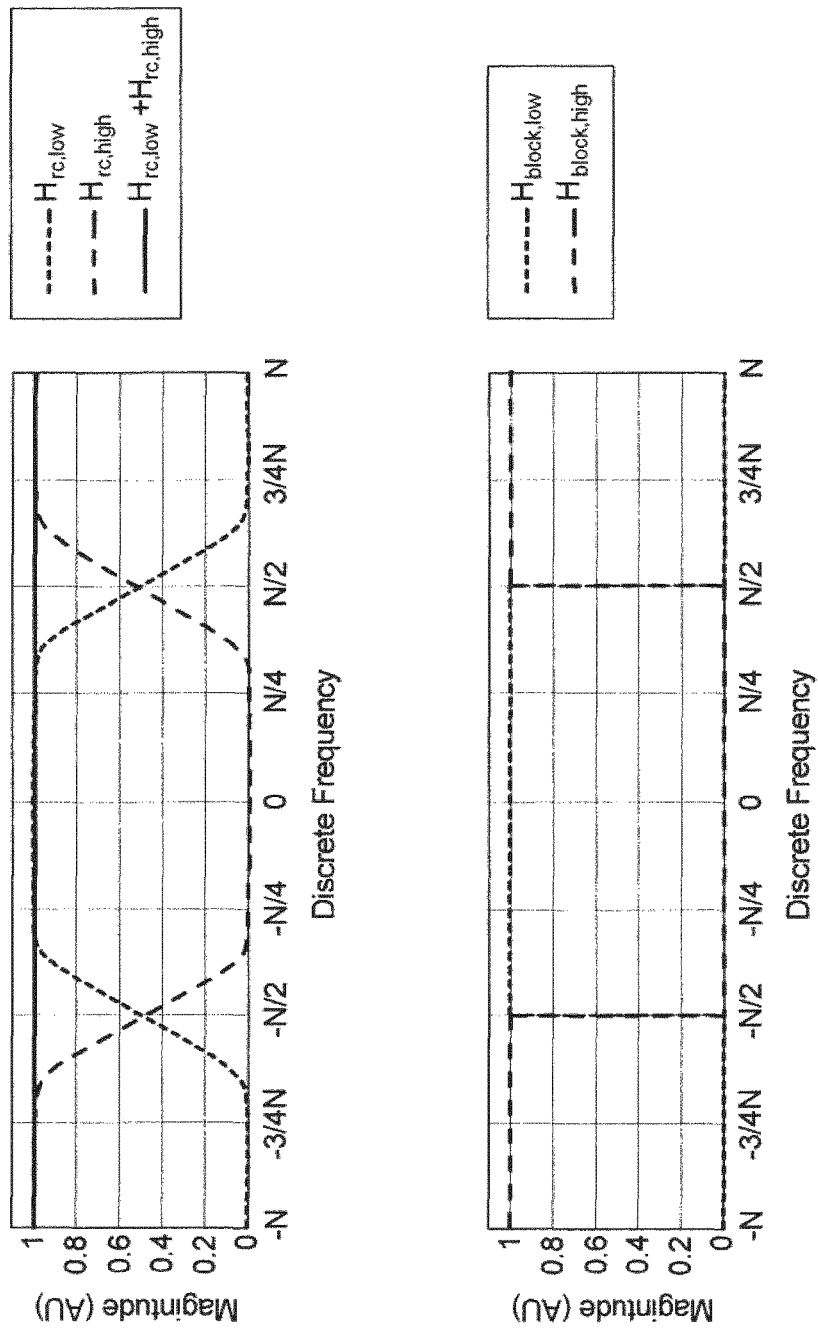
FIG. 20 shows the frequency response of raised cosine frequency domain filters and brickwall filters, respectively.

Another possibility is raised cosine filtering (see FIG. 19). The frequency samples which are multiplied by zeros in the raised cosine function may be removed as illustrated in the figure in order to perform a rate conversion. The frequency response of raised cosine filters $H_{rc,\ low}$ and $H_{rc,\ high}$ are illustrated in FIG. 20a). FIG. 20b) shows the frequency response of brick wall filters $H_{block,\ low}$ and $H_{block,\ high}$.

Figure 21:
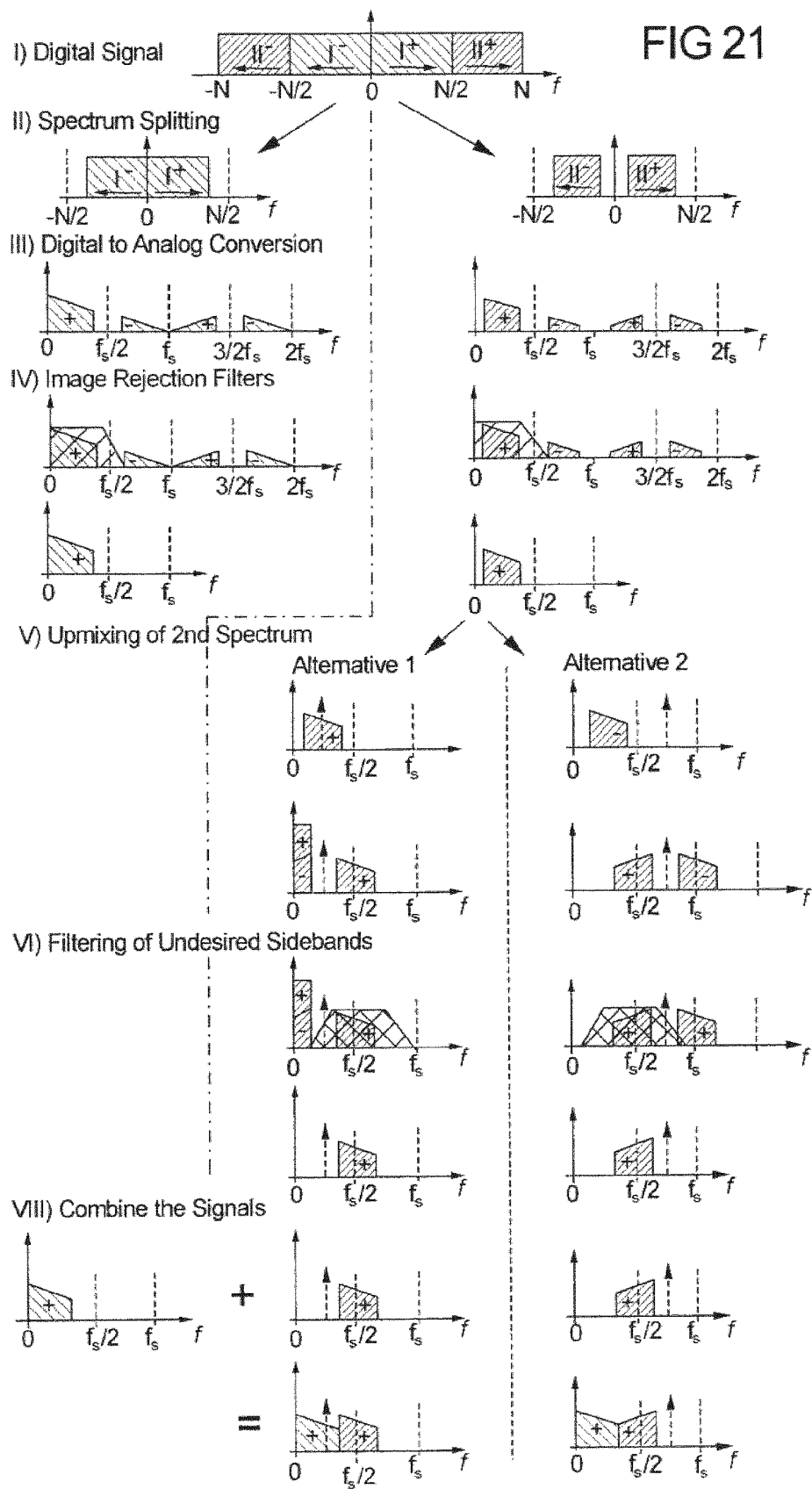
FIG. 21 shows a diagram illustrating another embodiment of a signal processing method according to the invention.

FIG. 21 illustrates a method for data processing according to another variant of the invention. Again, at least a first and a second DAC is provided and a sampled signal is split into a first and a second signal corresponding to different frequency portions of the sampled signal using a processing unit (steps I, II). Further, a first and a second analog signal is created using the first and the second DAC (step III). However, different from the method shown in FIG. 3, oversampled first and second signals are generated and converted by the first and the second DAC in order to obtain the first and second analog signal. The oversampling can of course be combined with the pre-equalizing of the signals described above.

The oversampling (e.g. by inserting zeros in the digital spectra) is used in order to move the image bands away from the desired bands. Thus, appropriate analog filters (step IV and step VI) are able to eliminate the images almost completely such that cross talk between the processing channels may be avoided. The input spectrum may be divided unequally among the first and the second DAC since the signal in the first processing path undergoes filtering only once and thus does not require oversampling both at the high frequencies and the low frequencies. The oversampled second signal is not generated at base band, but at an intermediate frequency (digital upmixing or digital upconversion). Thus, spectral zeros are achieved both at high frequencies and at low frequencies. Then, the second signal is upconverted to the desired frequency using an LO (step V) and a sideband rejection filter (e.g. band pass, high pass or low pass filter) removes the undesired side band (step VI).

Figure 22:
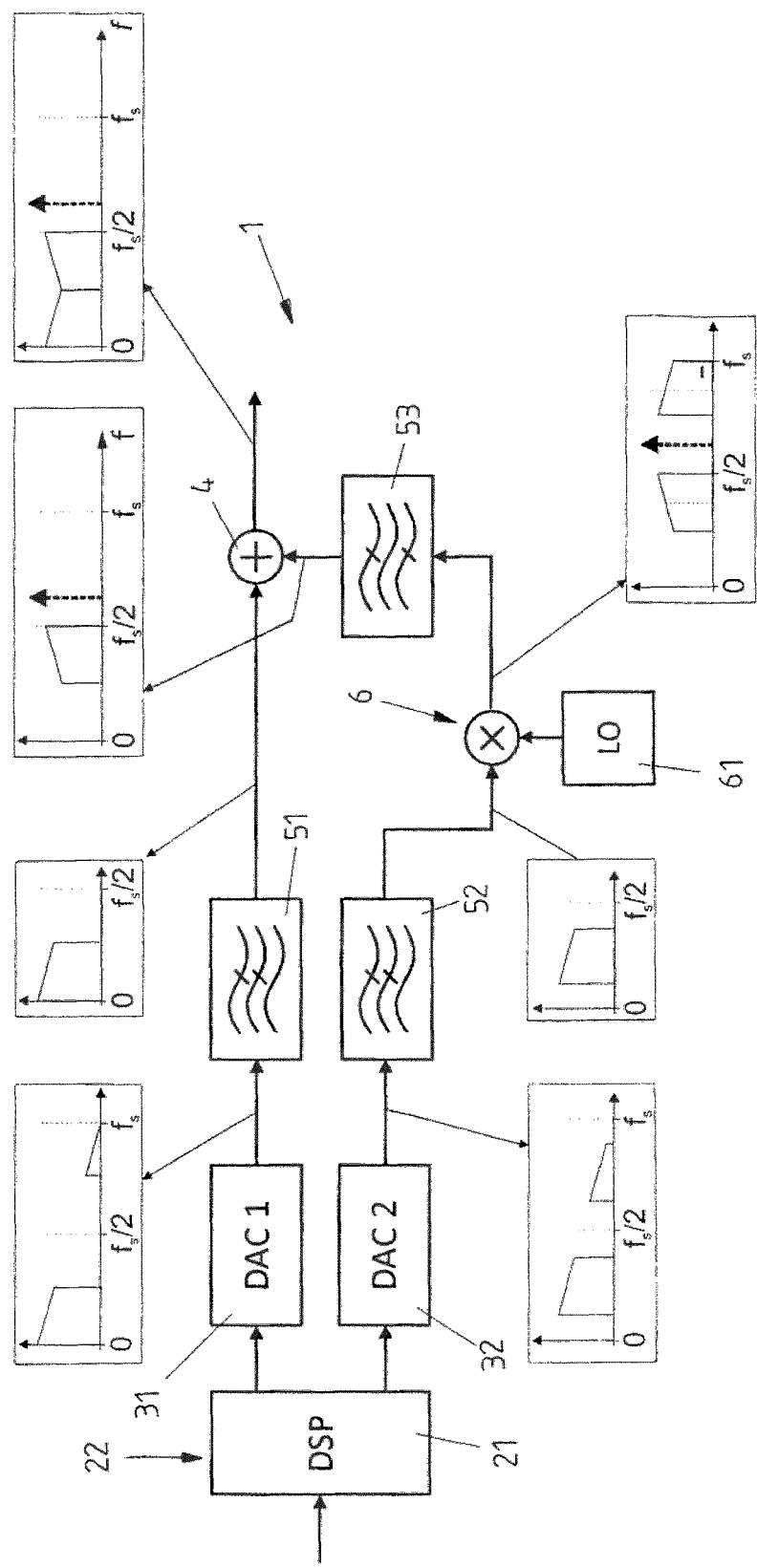
FIG. 22 shows a block diagram of the system of FIG. 1 showing spectra at specific positions of the system when carrying out the method illustrated in FIG. 21.

The principle design of a system 1 (being e.g. identical to the system illustrated in FIG. 1) for carrying out the oversampling method described above is shown in FIG. 22, wherein the signal spectra at specific location of the system 1 are also shown.

The invention claimed is:

1. A signal processing system, comprising
    at least a first, a second and a third digital-to-analog converter (DAC);
    a processing unit configured for splitting a sampled signal into at least a first and a second signal corresponding to different frequency portions of the sampled signal, transmitting the first signal to the first DAC, splitting the second signal into a first and a second sub signal and transmitting the first sub signal to the second DAC and the second subsignal to the third DAC, the first subsignal corresponding to the real part of the second signal and the second sub signal corresponding to the imaginary part of the second signal;
    an IQ mixer configured for mixing an analog output signal of the second DAC and an analog output signal of the third DAC;
    a combiner for combining an analog output signal of the first DAC and an output signal of the IQ mixer.

2. The system as claimed in claim 1, wherein the frequency portion that corresponds to the first signal comprises lower frequencies than the frequency portion that corresponds to the second signal.

3. The system as claimed in claim 1, wherein the processing unit is configured for carrying out the splitting of the sampled signal into the first and the second signal in the frequency domain.

4. The system as claimed in claim 1, wherein the processing unit is configured for carrying out the splitting of the sampled signal into the first and the second signal in the time domain.

5. The system as claimed in claim 1, wherein the processing unit is configured for carrying out a Fourier transform of the second signal for generating the first and the second subsignal.

6. The system as claimed in claim 1, further comprising at least one low pass filter for filtering the outputs of the DACs and/or a band pass or a low pass or a high pass filter for filtering the output of the IQ mixer.

7. The system as claimed in claim 1, wherein the processing unit is realized by a digital signal processor.

8. The system as claimed in claim 1, wherein the IQ mixer is configured for single sideband modulation.

9. The system as claimed in claim 1, wherein the IQ mixer is realized by an opto-electronic modulator.

10. A signal processing method, in particular using the system according to claim 1, the method comprising the steps of:
    providing at least a first and a second digital-to-analog converter (DAC);
    splitting a sampled signal into at least a first and a second signal corresponding to different frequency portions of the sampled signal by means of a processing unit;
    pre-equalizing the first and the second signal;
    converting the pre-equalized first signal into a first analog signal using the first DAC;
    converting the pre-equalized second signal into a second analog signal using the second DAC;
    combining the first and the second analog signal using a combiner,
    wherein the processing unit, the first DAC and the combiner define a first processing channel,
    wherein the processing unit, the second DAC and the combiner define a second processing channel,
    wherein the pre-equalized first signal is generated by processing the first signal in such a way that the pre-equalized first signal compensates cross talk between the first and the second processing channel, and/or the pre-equalized second signal is generated by processing the second signal in such a way that the pre-equalized second signal compensates cross talk between the first and the second processing channel.

11. The method as claimed in claim 10, wherein generating the pre-equalized first and second signal is carried out using the results of a calibration measurement with respect to at least a spatial, frequency and/or time portion of the first and/or the second processing channel.

12. The method as claimed in claim 11, wherein the calibration measurement is carried out using a channel estimation scheme with respect to the first and/or the second processing channel.

13. The method as claimed in claim 12, wherein the channel estimation scheme comprises treating the combination of the first and the second processing channel as a MIMO system.

14. The method as claimed in claim 13, wherein the calibration measurement comprises determining coefficients of a frequency response matrix related to the MIMO system.

15. The method as claimed in claim 12, wherein the channel estimation scheme comprises transmitting a channel estimation sequence to the first and/or the second DAC.

16. The method as claimed in claim 15, wherein a first channel estimation sequence is transmitted to the first DAC and a second channel estimation sequence is transmitted to the second DAC, wherein the first channel estimation sequence is distinguishable from the second channel estimation sequence.

17. The method as claimed in claim 11, wherein the calibration measurement comprises an S- and/or X-parameter measurement of at least a part of an analog section of the first and/or the second processing channel.

18. The method as claimed in claim 10, wherein the pre-equalized first and second signal are generated adaptively by means of the results of re-calibration measurements carried out using a portion of an analog signal produced by the combiner.

19. The method as claimed in claim 10, further comprising creating an oversampled first signal and converting the oversampled first signal by the first DAC in order to obtain the first analog signal and/or creating an oversampled second signal and converting the oversampled second signal by the second DAC in order to obtain the second analog signal.

20. A signal processing system, in particular for carrying out the method according to claim 10, the system comprising:
 a processing unit configured for splitting a sampled signal into at least a first and a second signal corresponding to different frequency portions of the sampled signal;
 a pre-equalizing unit for pre-equalizing the first and the second signal;
 at least a first digital-to-analog converter (DAC) for converting the pre-equalized first signal into a first analog signal and a second DAC for converting the pre-equalized second signal into a second analog signal;
 a combiner for combining the first and the second analog signal,
 wherein the processing unit, the first DAC and the combiner define a first processing channel,
 wherein the processing unit, the second DAC and the combiner define a second processing channel,
 wherein pre-equalizing unit is configured for generating the pre-equalized first signal by processing the first signal in such a way that the pre-equalized first signal compensates cross talk between the first and the second processing channel, and/or for generating the pre-equalized second signal by processing the second signal in such a way that the pre-equalized second signal compensates cross talk between the first and the second processing channel.

* * * * *